United States Patent
Ausserlechner

(10) Patent No.: US 10,578,680 B2
(45) Date of Patent: Mar. 3, 2020

(54) HALL SENSOR DEVICES AND METHODS FOR OPERATING THE SAME

(71) Applicant: Infineon Technologies AG, Neubiberg (DE)

(72) Inventor: Udo Ausserlechner, Villach (AT)

(73) Assignee: Infineon Technologies AG (DE)

( * ) Notice: Subject to any disclaimer, the term of this patent is extended or adjusted under 35 U.S.C. 154(b) by 218 days.

(21) Appl. No.: 15/664,297

(22) Filed: Jul. 31, 2017

(65) Prior Publication Data
US 2018/0031644 A1   Feb. 1, 2018

(30) Foreign Application Priority Data

Aug. 1, 2016 (DE) .......................... 10 2016 114 174

(51) Int. Cl.
*G01R 33/00* (2006.01)
*G01R 33/07* (2006.01)

(52) U.S. Cl.
CPC ......... *G01R 33/0029* (2013.01); *G01R 33/07* (2013.01)

(58) Field of Classification Search
CPC .... G01R 33/07; G01R 33/072; G01R 33/075; G01R 33/066; G01R 15/202
See application file for complete search history.

(56) References Cited

U.S. PATENT DOCUMENTS

| | | |
|---|---|---|
| 4,668,914 A | 5/1987 | Kersten et al. |
| 5,747,995 A | 5/1998 | Spies |
| 6,927,572 B2 | 8/2005 | Motz |
| 9,494,661 B2 | 11/2016 | Paul et al. |
| 9,520,551 B2 | 12/2016 | Kolb et al. |

(Continued)

FOREIGN PATENT DOCUMENTS

| | | |
|---|---|---|
| CN | 104181475 A | 12/2014 |
| DE | 102 04 427 A1 | 8/2003 |

(Continued)

OTHER PUBLICATIONS

Ausserlechner, Udo, "Limits of offset cancellation by the principle of spinning current Hall probe", Infineon Technologies AG, Austria, Oct. 24-27, 2004, 4 pgs.

(Continued)

*Primary Examiner* — Huy Q Phan
*Assistant Examiner* — Adam S Clarke
(74) *Attorney, Agent, or Firm* — Design IP

(57) ABSTRACT

A Hall sensor device includes a Hall effect region of a first conductivity type, electrical contact regions configured to provide electrical signals to/from the Hall effect region, and circuitry. Each electrical contact region is formed in a respective well of a second conductivity type that adjoins the Hall effect region. Circuitry includes control terminals, wherein each control terminal is configured to control a conductance in an associated well of the second conductivity type. The circuitry is configured to selectively apply control signals to a first subset of the control terminals to form channels conducting majority carriers of the first conductivity type in the associated wells during a first operating phase, and to selectively apply control signals to a second subset of the control terminals to form channels conducting majority carriers of the first conductivity type in the associated wells during a second operating phase.

27 Claims, 10 Drawing Sheets

(56) References Cited

U.S. PATENT DOCUMENTS

| | | | |
|---|---|---|---|
| 9,612,262 B1* | 4/2017 | Nehmeh | G01R 15/202 |
| 2009/0121707 A1 | 5/2009 | Schott | |
| 2013/0073238 A1* | 3/2013 | Nomura | G01R 33/09 |
| | | | 702/64 |
| 2013/0342196 A1* | 12/2013 | Ausserlechner | G01R 33/07 |
| | | | 324/251 |
| 2014/0070795 A1* | 3/2014 | Kolb | G01R 33/07 |
| | | | 324/202 |
| 2015/0002140 A1* | 1/2015 | Lee | G01R 33/07 |
| | | | 324/207.2 |

FOREIGN PATENT DOCUMENTS

| | | |
|---|---|---|
| DE | 10 2013 218 109 A1 | 3/2014 |
| FR | 2947060 A1 | 12/2010 |
| NL | 1025089 C2 | 6/2005 |
| WO | 98/10302 | 3/1998 |
| WO | 2005073744 A1 | 8/2005 |

OTHER PUBLICATIONS

Ausserlechner, Udo, "A method to compute the Hall-geometry factor at weak magnetic field in closed analytical form", Springer-Verlag Berlin Heidelberg, publ. Dec. 22, 2015, 20 pgs.

Jeroen C. van der Meer, Frank R. Riedijk, Edward van Kampen, Kofi A. A. Makinwa, and Johan H. Huijsing, "A fully integrated CMOS Hall sensor with a 3.65µT 3σ offset for compass applications", 2005 IEEE International Solid-State circuits Conference, Session 13 (13.5), Feb. 8, 2005, 2 pgs.

* cited by examiner

During 1st spinning scheme:

During 2nd spinning scheme:

During 1st spinning scheme:

During 2nd spinning scheme:

During 3<sup>rd</sup> spinning scheme:

During 4<sup>th</sup> spinning scheme:

HALL SENSOR DEVICES AND METHODS FOR OPERATING THE SAME

FIELD

Examples disclosed herein relate to operating Hall sensor devices using spinning schemes. In particular, examples relate to Hall sensor devices and methods for operating the same.

BACKGROUND

Hall sensor devices are semiconductor devices used to a measure magnetic field. They produce an output signal proportional to the magnetic field. At zero magnetic field, they tend to output a signal, which is usually different from zero: this is their offset error (i.e., zero field error).

Hall sensor devices comprise a Hall effect region where the Hall effect takes place and three or more contacts in or in ohmic contact with the Hall effect region. A contact may be understood as a contact tub located in or in touch with the Hall effect region. An electrical contact to the Hall sensor region may be made by a contact diffusion or implantation process, for example. Sometimes several contacts can be connected via metal lines (in the interconnect layer of the semiconductor technology) to the same terminal. Terminals can be used to supply the device with electric power and to tap its output signals.

Hall plates, which are also known as Horizontal Hall sensor devices or HHalls, are flat devices with thicknesses 5 to infinitely (typically 50) times smaller than their lateral size. They are used to detect magnetic field components along their thickness direction (i.e. the direction into the semiconductor substrate). In silicon technology, Hall plates are currently typically 1 to 3 µm thick and 10 to 100 µm large in lateral directions. Their layout can be rectangular, square, circular, octagonal, cross-shaped, or even triangular.

Vertical Hall sensor devices or VHalls are stout devices where one lateral dimension is comparable (0.2 times up to 10 times) to their thickness direction (i.e. direction into the semiconductor substrate). They often have the shape of long stripes, mostly straight, sometimes curved, arc-shaped, or even circular rings. They can be used to detect magnetic field components parallel to the semiconductor main surface.

The terms "horizontal" and "vertical" denote the orientation of the plate-like geometry of the devices with respect to the main surface of the semiconductor die.

One approach for reducing or eliminating offset error is using a multi-contact Hall sensor. Three-contact or four-contact HHalls or VHalls may be operated in a spinning current-type mode, which changes the supply or sense role of the contacts in multiple clock phases such that any offset is reduced when the signals from the multiple clock phases are combined. The residual offset generally depends on the supply voltage, at which the device is operated: with larger supply voltage the residual offset grows. This is caused by self-heating and electrical non-linearities of the devices, which are larger at larger supply voltages. In order to achieve low residual offset the devices need to be operated at low supply voltage of e.g., 0.5V (instead of larger supply voltages of 2 to 3V). Even so, the residual offset error can remain higher than desired, such as in the range of about 1 milli-Tesla (mT).

Hence, there may be a desire for operating Hall sensor devices with reduced residual offset error.

SUMMARY

Examples provided herein relate to Hall sensor devices and methods for operating the same An example relates to a Hall sensor device. The Hall sensor device comprises a Hall effect region of a first conductivity type, and a plurality of electrical contact regions configured to provide electrical signals to/from the Hall effect region. Each electrical contact region is formed in a respective well of a different second conductivity type which adjoins the Hall effect region. The Hall sensor device further comprises circuitry comprising a plurality of control terminals, wherein each control terminal is configured to control a conductance in an associated well of the second conductivity type. The circuitry is configured to selectively apply control signals to a first subset of the plurality of control terminals to form channels conducting majority carriers of the first conductivity type in the associated wells during a first operating phase. The circuitry is further configured to selectively apply control signals to a different second subset of the plurality of control terminals to form channels conducting majority carriers of the first conductivity type in the associated wells during a second operating phase.

Another example relates to a further Hall sensor device. The Hall sensor device comprises a Hall effect region of a first conductivity type which is implemented in a semiconductor substrate, and a plurality of electrical contact regions which are implemented in the semiconductor substrate. The plurality of electrical contact regions are configured to provide electrical signals to/from the Hall effect region. Further, the Hall sensor device comprises a plurality of control terminals configured to form during a first operating phase a first plurality of channels in the semiconductor substrate between the Hall effect region and a first subset of the plurality of electrical contact regions. The channels conduct majority carriers of the first conductivity type. The plurality of control terminals are further configured to form during a second operating phase a second plurality of channels in the semiconductor substrate between the Hall effect region and a different second subset of the plurality of electrical contact regions. Again, the channels conduct majority carriers of the first conductivity type.

Still another example relates to a still further Hall sensor device. The Hall sensor device comprises a Hall effect region and a plurality of electrical contact regions. The plurality of electrical contact regions are configured to provide electrical signals to/from the Hall effect region. Further the Hall sensor device comprises circuitry configured to selectively couple a first subset of the plurality of electrical contact regions to the Hall effect region during at least one first operating phase, and to selectively couple a different second subset of the plurality of electrical contact regions to the Hall effect region during at least one second operating phase. Each of the second subset of the plurality of electrical contact regions exhibits a high ohmic boundary condition to the Hall effect region during the first operating phase, and each of the first subset of the plurality of electrical contact regions exhibits a high ohmic boundary condition to the Hall effect region during the second operating phase.

Hall sensor devices according to examples described herein may allow to selectively activate and deactivate single ones of the plurality of electrical contact regions. Activated electrical contact regions short a part of the electrical signal from the Hall effect region, or they short a part of the electrical current flowing through the Hall effect region. Hence, a magnetic sensitivity of the Hall sensor device and a Signal-to-Noise Ratio (SNR) of the electrical signal from the Hall effect region may be increased since merely part of all the electrical contact regions is activated during a respective operating phase. Furthermore, combining the electrical signals from the Hall effect region provided by the electrical contact regions during the respective operating phases may allow to provide an output signal of the Hall sensor device with reduced residual offset.

A further example relates to a method for operating a Hall sensor device comprising a Hall effect region of a first conductivity type and a plurality of electrical contact regions configured to provide electrical signals to/from the Hall effect region using a plurality of control terminals. Each electrical contact region is formed in a respective well of a different second conductivity type which adjoins the Hall effect region, and each control terminal is configured to control a conductance in an associated well of the second conductivity type. The method comprises selectively applying control signals to a first subset of the plurality of control terminals to form channels conducting majority carriers of the first conductivity type in the associated wells during a first operating phase. The method further comprises selectively applying control signals to a different second subset of the plurality of control terminals to form channels conducting majority carriers of the first conductivity type in the associated wells during a second operating phase.

A still further example relates to a method for a Hall sensor device comprising a Hall effect region. The method comprises supplying electric energy to the Hall effect region using a first pair of electrical contacts and tapping an output signal of the Hall effect region using a second pair of electrical contacts in a first operating phase. In a second operating phase, the method comprises supplying electric energy to the Hall effect region using the second pair of electrical contacts and tapping an output signal of the Hall effect region using the first pair of electrical contacts. Further the method comprises supplying electric energy to the Hall effect region using a third pair of electrical contacts and tapping an output signal of the Hall effect region using a fourth pair of electrical contacts in a third operating phase. In a fourth operating phase, the method comprises supplying electric energy to the Hall effect region using the fourth pair of electrical contacts and tapping an output signal of the Hall effect region using the third pair of electrical contacts. At least one electrical contact of the third and the fourth pair of electrical contacts exhibits a high ohmic boundary condition to the Hall effect region during the first operating phase, and at least one electrical contact of the first and the second pair of electrical contacts exhibits a high ohmic boundary condition to the Hall effect region during the second operating phase.

Methods according to examples described herein may allow to selectively activate and deactivate single ones of the plurality of electrical contact regions (electrical contacts) of a Hall sensor device. Accordingly, a magnetic sensitivity of the Hall sensor device and an SNR of the electrical signal from the Hall effect region may be increased since merely part of all the electrical contact regions (electrical contacts) is activated during an operating phase. Furthermore, combining the electrical signals from the Hall effect region provided by the electrical contact regions (electrical contacts) during the respective operating phases may allow to provide an output signal of the Hall sensor device with reduced residual offset.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent", to name just a few examples).

The terminology used herein is for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

Figure 1:
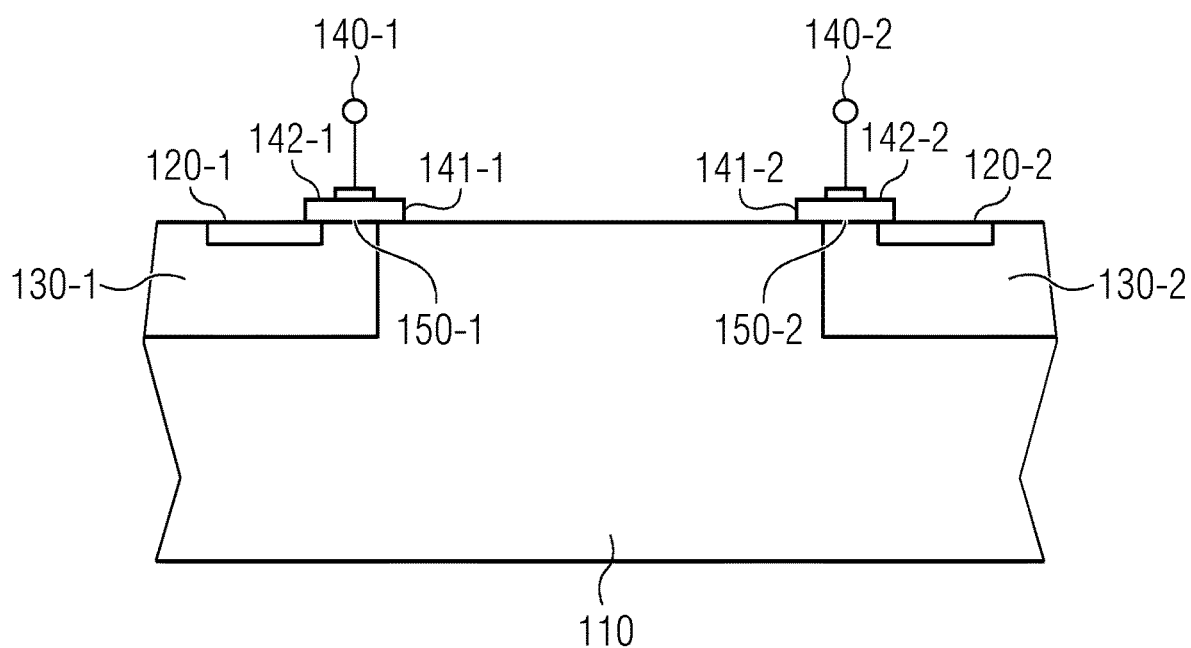
FIG. 1 illustrates an example of a Hall sensor device according to one or more embodiments.

FIG. 1 illustrates a cross section of a Hall sensor device 100. The Hall sensor device 100 comprises a Hall effect region 110 of a first conductivity type (e.g. n-doped), in which the Hall effect takes place when an external magnetic field (not illustrated) is present.

The Hall sensor device 100 further comprises a plurality of electrical contact regions configured to provide electrical signals to/from the Hall effect region (for this purpose, the electrical contact regions may be coupled to respective terminals). For the sake of simplicity, merely two electrical contact regions 120-1 and 120-2 are illustrated. However, it is to be noted that any number of electrical contact regions may be provided. For example, 2, 3, 4, 8, 16, 24, 32 or more electrical contact regions may be provided. Each electrical contact region is formed in a respective well of a different second conductivity type (e.g. p-doped) which adjoins the Hall effect region 110. For example, electrical contact region 120-1 is formed in well 130-1 and electrical contact region 120-2 is formed in well 130-2, wherein both wells 130-1 and 130-2 adjoin the Hall effect region 110 (i.e. each well of the second conductivity type shares a common boundary with the Hall effect region 110). For example, at least one (or all) of the plurality of electrical contact regions may be of the first conductivity type. Alternatively, one or more of the plurality of electrical contact regions may be formed by a metal contact.

The Hall sensor device 100 further comprises circuitry comprising a plurality of control terminals. For the sake of simplicity, again merely two control terminals 140-1 and 140-2 are illustrated. Each control terminal is configured to control a conductance in an associated well of the second conductivity type. That is, the control terminal 140-1 controls the conductance in well 130-1 and the control terminal 140-2 controls the conductance in well 130-2. For example, a control terminal may control the conductance in an associated well by controlling the specific conductance of a channel which is formed in the well, or by controlling a geometrical change of a current path through the well.

In the example illustrated in FIG. 1, the control terminals 140-1 and 140-2 are coupled to respective electrodes 142-1 and 142-2 (e.g. made of low-ohmic poly-silicon) which are formed on respective oxide layers 141-1 and 141-2. The oxide layers are formed on top of the wells of the second conductivity type. Accordingly, inversion layers at the interfaces between the respective wells of the second conductivity type and the oxide layers may be formed (depending on the potential at the control terminals). Theses inversion layers serve as channels for conducting majority carriers of the first conductivity type. Hence, the control terminals allow to control the specific conductance of channels in the wells of the second conductivity type.

The circuitry is configured to selectively apply control signals to a first subset of the plurality of control terminals to form channels conducting majority carriers of the first conductivity type in the associated wells during a first operating phase (e.g. by applying a first potential to the respective control terminals). That is, at least one of the plurality of control terminals is not comprised by the first subset. For example, the control terminal 140-1 may be comprised by the first subset of the plurality of control terminals. Hence, a control signal is applied to the control terminal 140-1 during the first operating phase. Accordingly, a channel 150-1 conducting majority carriers of the first conductivity type in the associated well 130-1 is formed. That is, an electrically conductive channel is formed between the Hall effect region 110 and the electrical contact region 120-1 during the first operating phase. Further, the control terminal 140-2 may be not comprised by the first subset of the plurality of control terminals, so that the control signal applied to the control terminal 140-2 during the first operating phase (e.g. a different second potential) does not cause the formation of a channel conducting majority carriers of the first conductivity type in the associated well 130-2 during the first operating phase. That is, no electrically conductive channel is formed between the Hall effect region 110 and the electrical contact region 120-2 during the first operating phase.

The circuitry is further configured to selectively apply control signals to a different second subset of the plurality of control terminals to form channels conducting majority carriers of the first conductivity type in the associated wells during a second operating phase (e.g. by applying the first potential to the respective control terminals). That is, at least one of the control terminals of the second subset is not comprised by the first subset of the plurality of control terminals. For example, the control terminal 140-2 may be comprised by the second subset of the plurality of control terminals. Hence, a control signal is applied to the control terminal 140-2 during the second operating phase. Accordingly, a channel 150-2 conducting majority carriers of the first conductivity type in the associated well 130-2 is formed. That is, an electrically conductive channel is formed between the Hall effect region 110 and the electrical contact region 120-2 during the second operating phase. Further, the control terminal 140-1 may be not comprised by the second subset of the plurality of control terminals, so that the control signal applied to the control terminal 140-1 during the second operating phase (e.g. the second potential) does not cause the formation of a channel conducting majority carriers of the first conductivity type in the associated well 130-1 during the second operating phase. That is, no electrically conductive channel is formed between the Hall effect region 110 and the electrical contact region 120-1 during the second operating phase.

Accordingly, single ones of the plurality of electrical contact regions may be selectively activated and deactivated. In general, an activated electrical contact region which is not used to supply an electrical signal (e.g. a current signal or a voltage signal) to the Hall effect region 110 or to tap an electrical signal from the Hall effect region 110 (i.e. to tap an output signal) short circuits part of the electrical supply signal (i.e. part of the current or voltage signal) or short circuits part of the output signal. Accordingly, the signal strength of the respective signals is decreased and the electrical field inside the Hall effect region 110 is increased. The inhomogeneity of the electrical field and the current/voltage distribution inside the Hall effect region 110 is thus increased—leading to an increased residual offset of the Hall sensor device. However, since controls signals are merely applied to the first subset of the plurality of control terminals, merely a first subset of the plurality of electrical contact regions is activated during the first operating phase. On the contrary, since controls signals are merely applied to the second subset of the plurality of control terminals, merely a second subset of the plurality of electrical contact regions is activated during the second operating phase. Hence, short circuiting of the electrical supply signal and short circuiting of the Hall effect region's output signal is reduced. The homogeneity of the electrical field and the current/voltage distribution inside the Hall effect region may, thus, be increased, so that the residual offset of the Hall sensor device 100 may be reduced compared to conventional approaches.

For example, the first operating phase may comprise a full first spinning scheme, whereas the second operating phase may comprise a full second spinning scheme. In a full spinning scheme, the supply or sense role of the activated electrical contact regions is changed in multiple clock phases: Each activated electrical contact region provides (supplies) an electrical signal to the Hall effect region 110 for an integer number n of clock phases and provides (taps) an electrical signal from the Hall effect region 110 for the same number n of clock phases. For example, in a spinning-current scheme with four activated electrical contact regions, a first and a second one of the four activated electrical contact regions supply a current signal to the Hall effect region 110 in a first clock phase, whereas a third and a fourth one of the four activated electrical contact regions tap the electrical signal (i.e. a voltage signal) from the Hall effect region 110. In a second clock phase, the third and fourth one of the four activated electrical contact regions supply the current signal to the Hall effect region 110, whereas the first and the second one of the four activated electrical contact regions tap the electrical signal from the Hall effect region 110. Similarly, in the case of a spinning-voltage scheme, a voltage signal is supplied to the Hall effect region 110 instead of a current signal, and a current signal is tapped from the Hall effect region instead of a voltage signal.

Since the electrical contract regions of the second subset of the plurality of contact regions are deactivated during the first spinning scheme, they do not short-circuit the electrical contract regions of the first subset of the plurality of contact regions. On the contrary, since the electrical contract regions of the first subset of the plurality of contact regions are deactivated during the second spinning scheme, they do not short-circuit the electrical contract regions of the second subset of the plurality of contact regions. The homogeneity of the electrical field and the current/voltage distribution inside the Hall effect region 110 may, thus, be increased for both spinning schemes. Accordingly, the residual offset of the Hall sensor device 100 may be reduced compared to conventional approaches—in particular if the output signals of the Hall effect region for both spinning schemes are combined.

In some examples, the Hall sensor device 100 may, hence, further comprise combining circuitry (not illustrated) configured to combine the electrical signals from the Hall effect region provided (tapped) by electrical contact regions during the first operating phase and the electrical signals from the Hall effect region provided (tapped) by the electrical contact regions during the second operating phase. The combined electrical signals from the Hall effect region 110 may form an output signal of the Hall sensor device 100. For example, the combining circuitry may be configured to linearly combine the electrical signals from the Hall effect region for both operating phases (e.g. both spinning schemes). In particular, the electrical signals from the Hall effect region may be summed or subtracted from each other, wherein the absolute value of the respective coefficients of the linear combination is equal to one. Accordingly, the output signal of the Hall sensor device 100 may exhibit reduced residual offset compared to conventional approaches.

The plurality of electrical contract regions may in some examples be arranged at a peripheral portion of the Hall effect region 110 as indicated in FIG. 1. This may be beneficial for the following reasons: If an asymmetry causing residual offset is located near the geometric center of the Hall effect region, it is rather irrelevant which electrical contract regions are used because this asymmetry is present in all electrical contract region configurations at half of the supply potentials due to a global symmetry of the arrangement. However, if an asymmetry is near one of the electrical contract regions, its effect on the residual offset depends on whether the contact is at low or high potential. That is, in one clock phase of a spinning scheme this electrical contract region is the high potential (current input) and in another one it is the low potential (current output) and in two further ones it is approximately at half of the supply potential because it is a sense output. Due to non-linear effects in the semiconductor (e.g. velocity saturation, self-heating, depletion junction of a pn-isolation of the Hall effect region and charge modulation at dielectrically isolated boundaries of the Hall effect region) an asymmetry close to an electrical contract region leads to equivalent circuit resistor diagrams, which have slightly different resistance values in each clock phase (depending on the potential of the electrical contract region). It is known that a spinning scheme achieves low residual offset merely when the equivalent circuit resistor diagrams have identical resistance values throughout all clock phases of the spinning scheme. Non-linearities change these resistance values during the various clock phases of the spinning scheme and lead to an increased residual offset. Hence, the Hall sensor device 100 is configured such that the electrical contract regions are not fixed at specific positions at the perimeter of the Hall effect region 110. Instead they can be activated and de-activated at arbitrary positions.

Figure 2:
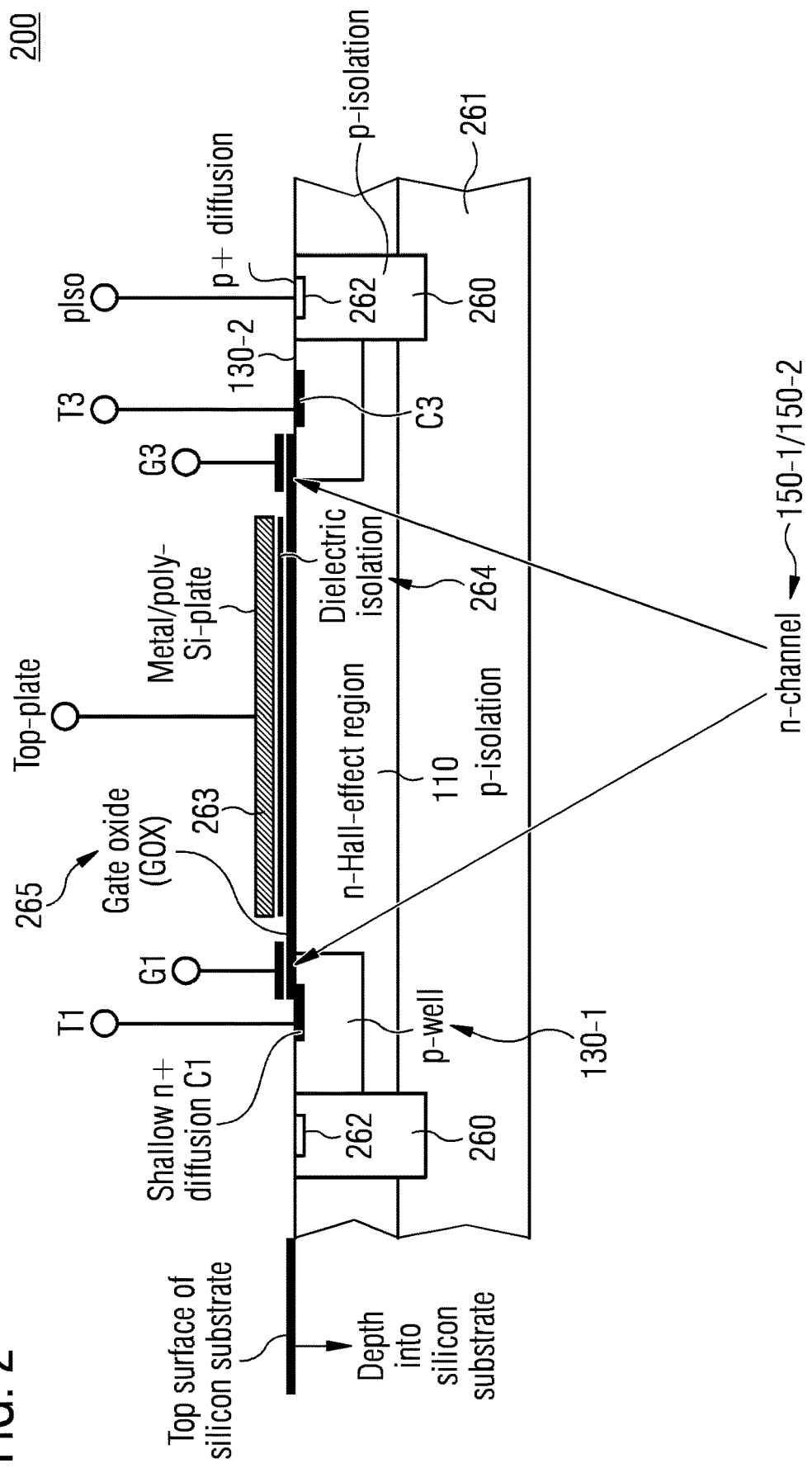
FIG. 2 illustrates another example of a Hall sensor device according to one or more embodiments.

In FIG. 2, another Hall sensor device 200 is illustrated. The Hall sensor device 200 is implemented in Metal Oxide Semiconductor (MOS) technology in a semiconductor substrate (e.g. a silicon substrate). The Hall sensor device 200 comprises a Hall effect region 110 in which the Hall effect takes place. For example, the Hall effect region 110 may be 0.5 to 5 μm deep (e.g. 1 μm). The Hall effect region 110 is of a first conductivity type. In the example illustrated in FIG. 2, the Hall effect region 110 is lightly n-doped silicon (e.g. $10^{15}$ to $10^{17}$ phosphorous or arsenic atoms per $cm^3$) because the mobility of electrons is three times larger than the mobility of holes in silicon and the output of the Hall effect region 110 is proportional to the mobility. The n-doped Hall effect region 110 region may also be an n-doped CMOS well (which is used for logic PMOS transistors in CMOS technology).

The sidewalls and the bottom of the Hall effect region 110 are isolated by a reverse biased pn-junction ring 260 and a reverse biased pn-junction plate 261. This p-isolation regions 260, 270 are contacted to metal of the interconnect layer by a heavily doped shallow p+ diffusion region 262 (e.g. 200 nm thickness) and are tied to a potential lower or equal to the lowest potential in the Hall effect region 110. The top of the Hall effect region 110 is covered by a conductive region 263 which is tied to a low potential (e.g. ground potential). In the example of FIG. 2, the conductive region 263 is implemented by a metal- or poly-crystalline silicon plate, which is isolated from the Hall-effect region by some thin dielectric layer 264. Alternatively a shallow p-doped tub above the n-doped Hall-effect region 110 may be used. However, the p-doped tub needs to be connected to a low potential like the p+ diffusion region 262.

The Hall sensor device further comprises a plurality of electrical contact regions configured to provide electrical signals to/from the Hall effect region 110. For the sake of simplicity, merely two contact regions C1 and C3 are illustrated. Each electrical contact region is formed in a respective well 130-1, 130-2 of a second conductivity type which adjoins the Hall effect region 110. Each electrical contact region may be activated or de-activated via a control signal (e.g. a control voltage) voltage at its gate (i.e. a control signal is received at a terminal coupled to the respective gate).

Between electrical contact region C1 and the n-doped Hall effect region 110 a p-doped well 130-1 (i.e. a well of a second conductivity type) is formed—like the one of an NMOS-transistor. The terminal T1 is in ohmic contact with the heavily doped shallow n+ diffusion region C1 (serving as electrical contact region). The region between the n+ diffusion region C1 and the n-doped Hall effect region 110 is covered by gate oxide 265 (e.g. 10 nm thick) and by a gate terminal G1 (e.g. a low-ohmic poly-silicon gate, optionally silicided). If the potential of the terminal G1 is at least a threshold voltage above the potential of the p-doped well 130-1, a conductive n-channel 150-1 is created via an inversion layer in the channel region. This channel connects the terminal C1 to the n-Hall-effect region—the contact C1 is active. That is, a channel conducting majority carriers of the first conductivity type (n type, i.e., electrons) in the associated well 130-1 is created. If the potential at the terminal G1 is too low (i.e. lower than the threshold voltage of this MOS-structure), no inversion layer is formed. Accordingly, the channel is not conductive (i.e. no channel conducting majority carriers of the first conductivity type is formed) and the electrical contact region C1 is not connected to the n-doped Hall effect region 110—the electrical contact region C1 is de-activated. The potential of the p-doped well 130-1 (which is equivalent to a bulk of an NMOS-transistor) may, e.g., be controlled by connecting it to dedicated terminals or by connecting it to the reverse biased pn-junction ring 260. The boundary region between the p-doped well 130-1 and the n-doped Hall effect region 110 behaves like an isolating boundary if the electrical contact region C1 is de-activated (i.e. when the potential at the terminal G1 is low). If the electrical contact region C1 is activated, the n-channel 150-1 is conductive, so that a shallow contact in the boundary region between the p-doped well 130-1 and the n-doped Hall effect region 110 is formed. The electrical contact region C1 is equivalent to a source contact of a NMOS-transistor. Hence, a single structure for contacting the Hall effect region 110 may be understood as an enhanced NMOS-transistor with the Hall effect region 110 being the drain of the NMOS-transistor.

The above configuration is the same for the other structures for contacting the Hall effect region 110—for example, for the structure comprising the electrical contact region C3, its associated p-doped well 130-2 and the terminal G3.

That is, a circuitry is formed which comprises a plurality of control terminals (G1, . . . , G3, . . . ). Each control terminal is configured to control a concentration of majority carriers of the first conductivity type (n type) in an associated well of the second conductivity type (p-doped wells). The circuitry is configured to selectively apply control signals to a first subset of the plurality of control terminals (e.g. G1 and G3) to form channels conducting majority carriers of the first conductivity type in the associated wells during a first operating phase, and to selectively apply control signals to a different second subset of the plurality of control terminals (e.g. G2 and G4—not illustrated) to form channels conducting majority carriers of the first conductivity type in the associated wells during a second operating phase.

Accordingly, the channels (e.g. 150-1, 150-2) conducting majority carriers of the first conductivity type in the associated wells during the first operating phase are formed between an associated first subset of the plurality of electrical contact regions (e.g. C1 and C3) and the Hall effect region 110, wherein the channels conducting majority carriers of the first conductivity type in the associated wells during the second operating phase are formed between an associated second subset of the plurality of electrical contact regions (e.g. C2 and C4—not illustrated) and the Hall effect region 110.

Single ones of the plurality of electrical contact regions may be selectively activated and deactivated. Since controls signals are merely applied to the first subset of the plurality of control terminals, merely a first subset of the plurality of electrical contact regions is activated during the first operating phase. On the contrary, since controls signals are merely applied to the second subset of the plurality of control terminals, merely a second subset of the plurality of electrical contact regions is activated during the second operating phase. Hence, short circuiting of the electrical supply signal and short circuiting of the Hall effect region's output signal is reduced. The homogeneity of the electrical field and the current/voltage distribution inside the Hall effect region may, thus, be increased, so that the residual offset of the Hall sensor device 200 may be reduced compared to conventional approaches. Especially, when the Hall effect region's output signals for the first operating phase (e.g. a first spinning scheme) and the second operating phase (e.g. a second spinning scheme) are combined to generate the output signal of the Hall sensor device 200.

Figure 3:
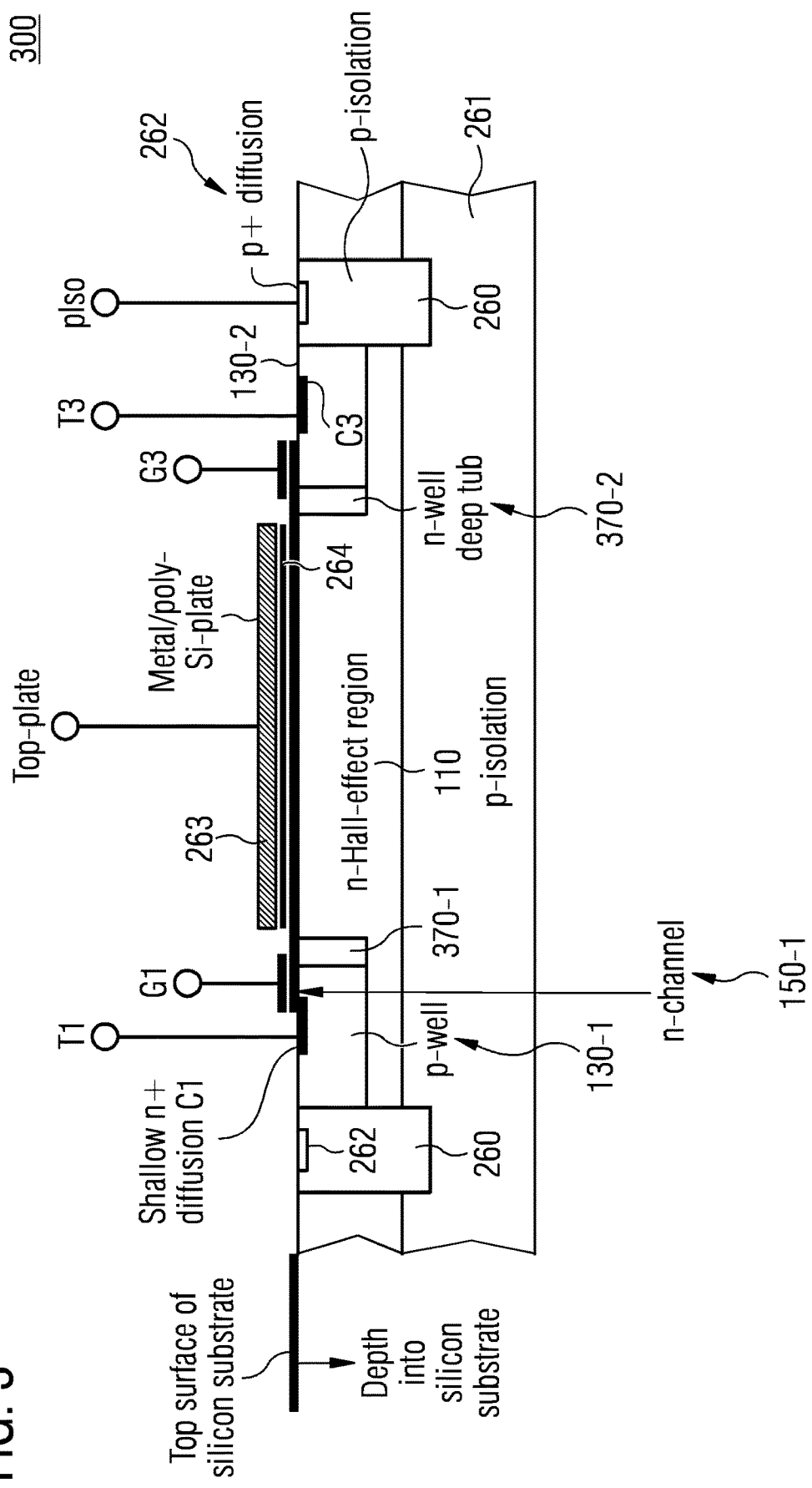
FIG. 3 illustrates still another example of a Hall sensor device according to one or more embodiments.

Another Hall sensor device 300 is illustrated in FIG. 3. The structure of the Hall sensor device 300 is similar to the one of Hall sensor device 200 illustrated in FIG. 2. However, the Hall sensor device 300 further comprises a plurality of wells of the first conductivity type (e.g. tiny n-doped CMOS wells), each adjoining the Hall effect region and an associated well of the second conductivity type. For the sake of simplicity, again, merely the two electrical contact regions C1 and C3 and their associated p-doped wells 130-1 and 130-2 are illustrated. As illustrated in FIG. 3, an n-doped well 370-1 may be arranged between a middle portion of the n-doped Hall effect region 110 and a side portion of the p-doped well 130-1 encircling the electrical contact region C1. Similarly, an n-doped well 370-2 may be arranged between the middle portion of the n-doped Hall effect region 110 and a side portion of the p-doped well 130-2 holding the electrical contact region C3.

A concentration of majority carriers of the first conductivity type in the wells 370-1 and 370-2 of the first conductivity type is higher than a concentration of majority carriers of the first conductivity type in the Hall effect region 110. In other words, the exemplary n-doped well 370-1 and 370-2 are higher doped then Hall effect region 110. A thickness of each well of the first conductivity type may be 50% or more of a thickness of the Hall effect region 110. As illustrated in FIG. 3, the thickness of each well of the first conductivity type may, e.g., be equal to the thickness of the Hall effect region 110. The wells 370-1 and 370-2 guide the electrical current from electrical contact region C1 into the Hall effect region 110. In this respect, the electrical current should not be crowded near the top surface of the device (where the MOS-channel is located), but the current should be homogeneous throughout the thickness of the Hall effect region 110.

Again, a circuitry is formed which comprises a plurality of control terminals G1, . . . , G3, etc. Each control terminal is configured to control a concentration of majority carriers of the first conductivity type (e.g. n type) in an associated well of the second conductivity type (e.g. p-doped wells). The circuitry is configured to selectively apply control signals to a first subset of the plurality of control terminals (e.g. G1 and G3) to form channels conducting majority carriers of the first conductivity type in the associated wells during a first operating phase, and to selectively apply control signals to a different second subset of the plurality of control terminals (e.g. G2 and G4—not illustrated) to form channels conducting majority carriers of the first conductivity type in the associated wells during a second operating phase.

Accordingly, the channels conducting majority carriers (e.g. channel 150-1) of the first conductivity type (e.g. n type) in the associated wells of the second conductivity type (e.g. p-doped wells 130-1 and 130-2) during the first operating phase are formed between an associated first subset of the plurality of electrical contact regions (e.g. C1 and C3) and an associated subset of the plurality of wells of the first conductivity type (e.g. n-doped well 370-1 and 370-2), wherein the channels conducting majority carriers of the first conductivity type in the associated wells of the second conductivity type during the second operating phase are formed between an associated second subset of the plurality of electrical contact regions (e.g. C2 and C4—not illustrated) and an associated second subset of the plurality of wells of the first conductivity type (not illustrated).

If an electrical contact region is de-activated, its tiny n-doped CMOS well (i.e. its associated well of the first conductivity type) is floating. On the other hand, if the electrical contact region is activated, the tiny n-doped CMOS well is connected via the n-channel to the respective electrical contact region. Hence, it may contact the Hall effect region 110 along its entire thickness. If the tiny n-doped CMOS well reaches through the entire depth of the Hall-effect region 110 (i.e. its thickness is equal to a thickness of the Hall effect region 110), it may reduce the electrical field and the current density when an electrical contact region is activated and current is flowing over it compared to a configuration without the tiny n-doped CMOS well. Hence, the tiny n-doped CMOS well may reduce electrical non-linearities of the Hall sensor device 300. Accordingly, a residual offset of the output signal of the Hall effect region 110 may be reduced. Especially, when the Hall effect region's output signals for the first operating phase (e.g. a first spinning scheme) and the second operating phase (e.g. a second spinning scheme) are combined to generate the output signal of the Hall sensor device 300.

If the Hall effect region 110 is an n-CMOS-well, no deep tub with higher n-doping may be formed, so that the Hall effect region 110 may be either contacted by small shallow highly doped n+ diffusions or the channel region may enter the n-doped Hall-effect region 110 directly.

Figure 4:
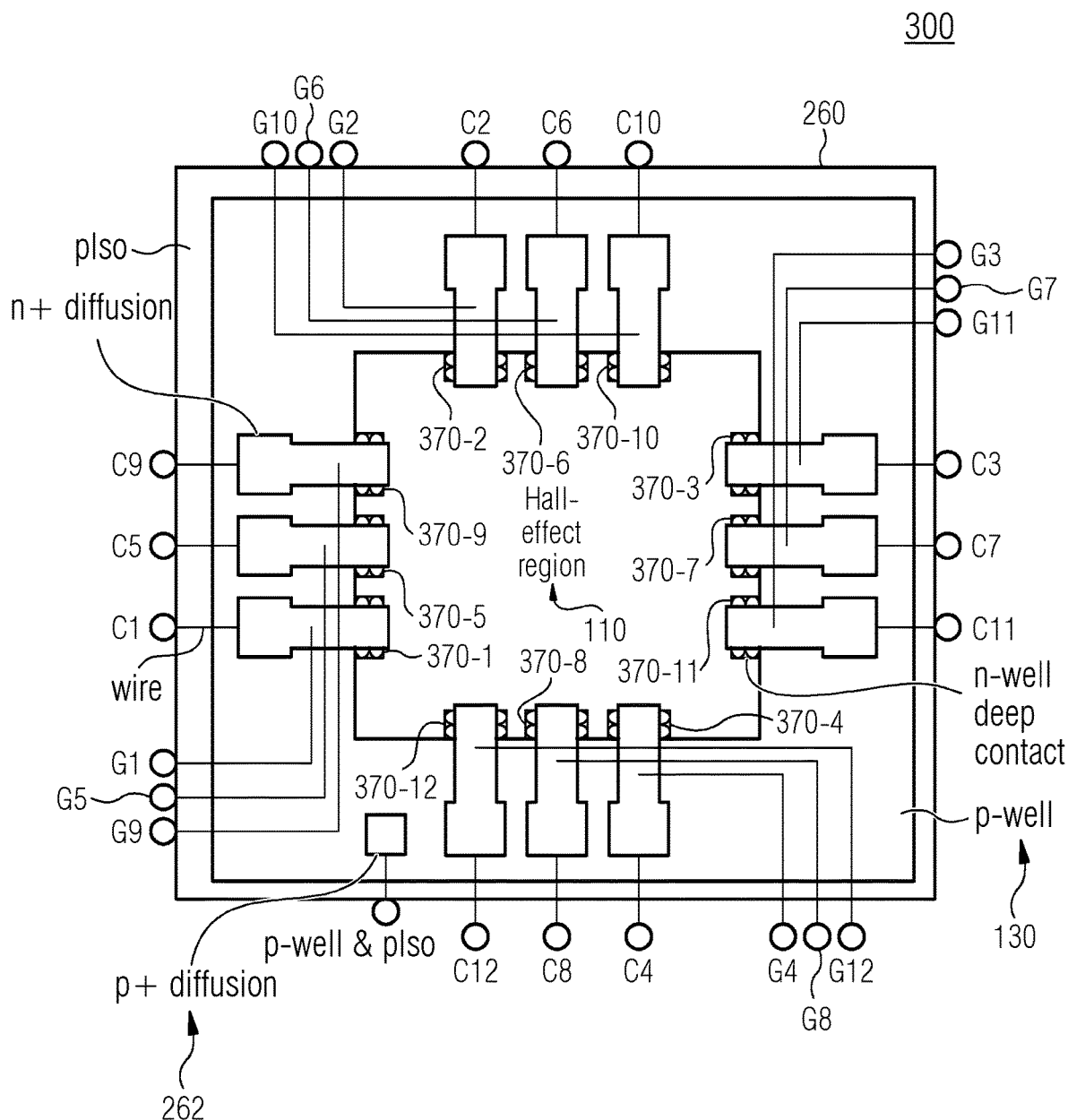
FIG. 4 illustrates a top view of the Hall sensor device illustrated in FIG. 3.

A top view of the Hall sensor device 300 of FIG. 3 is illustrated in FIG. 4. For the sake of clarity, the top plate 263 is not illustrated. Twelve electrical contact regions C1, . . . , C12 of a first conductivity type (n-type) are formed in a common well 130 of a second conductivity type (p-type). Wherein the portions of the common well 130 surrounding a respective electrical contact region form an associated well portion for the electrical contact region, which may be understood as respective well of the second conductivity type for the respective electrical contact region. Alternatively, the common well 130 of the second conductivity type may be split up into several parts, wherein each part encircles one or more channels conducting majority carriers of the first conductivity type. The common well 130 adjoins the Hall effect region 110. Twelve wells 370-1, . . . , 370-12 of the first conductivity type (n-type) are formed, each adjoining the Hall effect region 110 and an associated well portion of the second conductivity type. Further, twelve control terminals G1, . . . , G12 are formed to control a concentration of majority carriers of the first conductivity type in an associated well portion of the second conductivity type.

During a first operating phase (e.g. a first spinning scheme), control signals are selectively applied to a first subset of the plurality of control terminals G1, . . . , G12 to form channels conducting majority carriers of the first conductivity type in the associated well portions. For example, control signals may be applied to the control terminals G1, G2, G3 and G4 to form n-conducting channels in associated well portions between the electrical contact regions C1, C2, C3 and C4, and the wells 370-1, 370-2, 370-3 and 370-4, respectively. Hence, a current or a voltage signal may be applied to the Hall effect region 110 during the first operating phase as well as an output signal of the Hall effect region 110 may be tapped from the Hall effect region 110 using the electrical contact regions C1, C2, C3 and C4.

During a second operating phase (e.g. a second spinning scheme), control signals are selectively applied to a different second subset of the plurality of control terminals G1, . . . , G12 to form channels conducting majority carriers of the first conductivity type in the associated well portions. For example, control signals may be applied to the control terminals G5, G6, G7 and G8 to form n-conducting channels in associated well portions between the electrical contact regions C5, C6, C7 and C8, and the wells 370-5, 370-6, 370-7 and 370-8, respectively. Hence, a current or a voltage signal may be applied to the Hall effect region 110 during the second operating phase as well as an output signal of the Hall effect region 110 may be tapped from the Hall effect region 110 using the electrical contact regions C5, C6, C7 and C8.

Since merely fractions of the plurality of electrical contact regions C1, . . . , C12 are activated during both operating phases, short circuiting of the electrical supply signal and short circuiting of the Hall effect region's output signal is reduced. The homogeneity of the electrical field and the current/voltage distribution inside the Hall effect region 100 may, thus, be increased, so that the residual offset of the Hall sensor device 300 may be reduced compared to conventional approaches. Especially, when the Hall effect region's output signals for the first operating phase and the second operating phase are combined to generate the output signal of the Hall sensor device 300. The wells 370-1, . . . , 370-12 may reduce electrical nonlinearities of the Hall sensor device 300. Accordingly, a residual offset of the output signal of the Hall effect region 110 may be further reduced.

Figure 5:
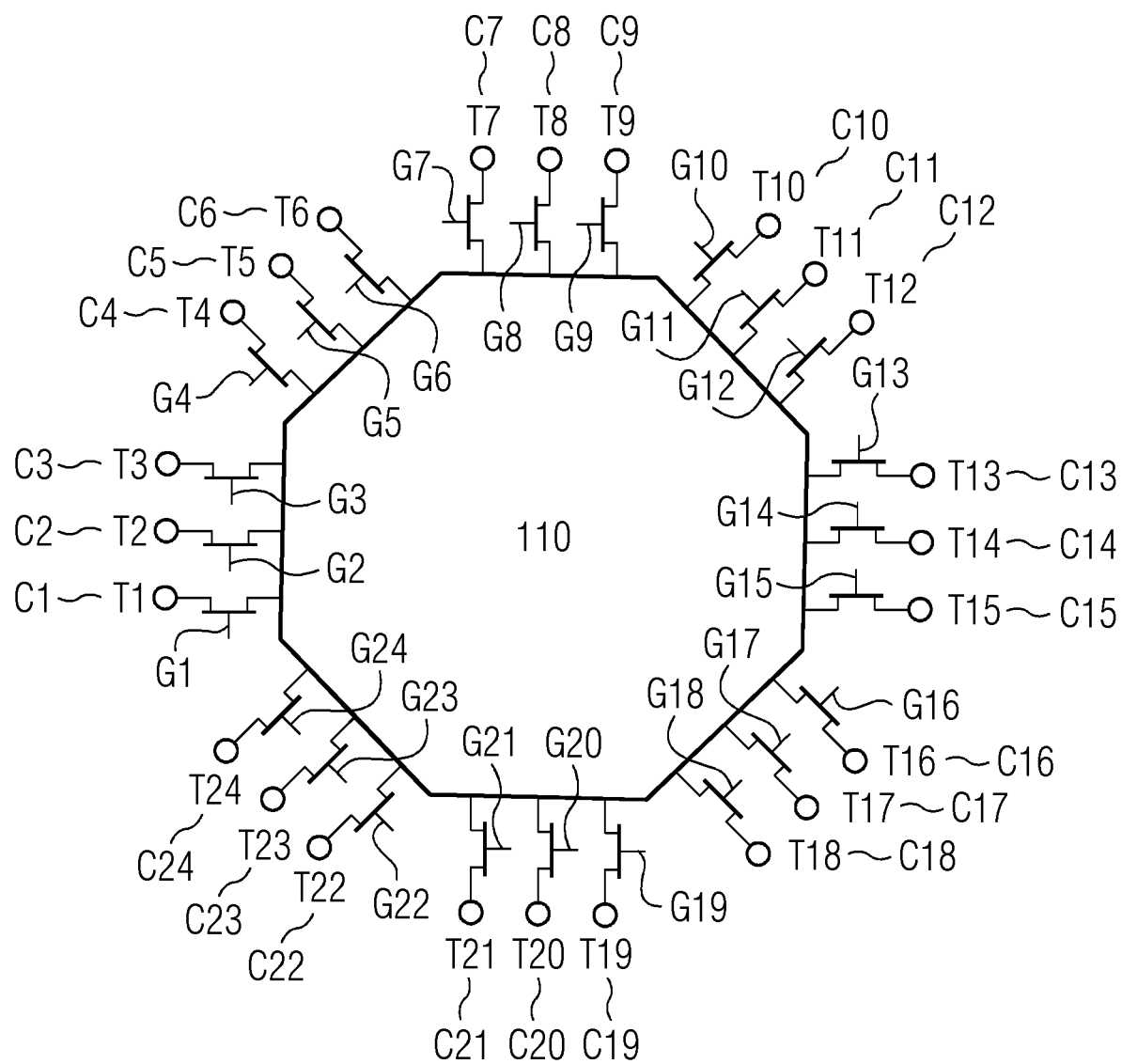
FIG. 5 illustrates an example of a contacting scheme for a Hall sensor device according to one or more embodiments.

FIG. 5 illustrates an example of a contacting scheme for a Hall sensor device 500. The Hall sensor device 500 comprises an n-doped Hall effect region 110 which is octagonal. Moreover, the Hall sensor device 500 comprises twenty-four NMOS-activated electrical contact regions C1, . . . , C24 with respective terminals T1, . . . , T24. The electrical contact regions are distributed evenly along the perimeter of the Hall sensor device 500. Each electrical contact region C1, . . . , C24 has its own gate terminal G1, ..., G24 (i.e. a control terminal), so that it can be switched on and off individually. Logic circuitry controls the activation/deactivation of the individual gate terminal G1, ..., G24 which act as switches for connecting the electrical contact region C1, ..., C24 to the Hall effect region 110.

If a certain switch is on, three other switches are also on. The locations of the electrical contact regions associated to these activated switches are rotated by 90°, 180°, and 270° around the center of the Hall-effect region with respect to the locations of the electrical contact region associated to a first one of the switches. In other words, the electrical contact regions of a first subset of the plurality of electrical contact regions are rotated by 90° with respect to each other about a geometrical center of the Hall effect region 110. For example, if gate terminal G1 is on, also gate terminals G7, G13 and G19 are on. Accordingly, terminals T1, T7, T13 and T19 are coupled to the Hall effect region 110. If, for example, gate terminal G5 is at high potential (i.e. the MOS-channel is activated), also gate terminals G11, G17 and G23 are at high potential. Accordingly, terminals T5, T11, T17 and T23 are coupled to the Hall effect region 110.

If a certain gate terminal (switch) is used to supply the Hall effect region 110 with electrical energy, also its diametrically opposite gate terminal (switch) is activated to supply the device with electrical energy. For example, if terminal T1 is used to supply (inject) a current to the Hall effect region 110, terminal T13 is used to extract the current. Accordingly, gate terminals G1 and G13 are activated. If, for example, terminal T2 is connected to a positive (i.e. high supply) voltage, terminal T14 is connected to a negative (i.e. low supply) voltage. Accordingly, gate terminals G2 and G14 are activated.

If a certain gate terminal (switch) is used to tap an output signal from the Hall effect region 110, also its diametrically opposite gate terminal (switch) is activated to tap an output signal. For example, if terminal T1 is connected to a non-inverting input of a voltmeter readout circuit, then also terminal T13 is connected to an inverting input of a voltmeter readout circuit (possibly but not necessarily the same voltmeter readout circuit). Accordingly, gate terminals G1 and G13 are activated. If terminal T2 is connected to a non-inverting input of an ampere meter readout circuit, then also terminal T14 is connected to an inverting input of an ampere meter readout circuit (possibly but not necessarily the same ampere meter readout circuit). Accordingly, gate terminals G2 and G14 are activated.

If the Hall effect region 110 is supplied with electrical energy by a current source through a first pair of activated diametrically opposite electrical contact regions (via associated activated gate terminals), its output signal is read out by a voltmeter circuit connected to a second pair of the activated diametrically opposite electrical contact regions (via associated activated gate terminals).

If the device is supplied with electrical energy by a voltage source through a first pair of activated diametrically opposite electrical contact regions (via associated activated gate terminals), its output signal is read out by an ampere meter circuit connected to a second pair of the activated diametrically opposite electrical contact regions (via associated activated gate terminals).

Several terminals may be combined to a terminal. For example, if terminals T1, T2 and T3 are used for current injection, they may be connected to the same current source. Alternatively, each one of them may be connected to an individual current source. For example, if terminals T1, T2 and T3 are used as ground potential, they may be connected to the same ground node. Alternatively, each of them may be connected to an individual ground node. For example, if terminals T1, T2 and T3 are used as voltage output terminals, they may be connected to the same non-inverting input terminal of a voltmeter circuit. Alternatively, each of them may be connected individually to its own dedicated non-inverting input terminal of a voltmeter circuit. Here are again two cases: three non-inverting input terminals of a single voltmeter circuit may be provided, or non-inverting input terminals of three different voltmeter circuits may be provided.

That is, a large number of MOS-switched electrical contact regions may result in a large number of possible operating modes. This may become complex, so that a large number of signal lines to all gate terminals acting as switches for the electrical contact regions, and to further switches that connect the electrical contact regions to the supply sources and readout circuits may be required. Various kinds of partitioning for controlling these operation modes may be used. For example, a single large logic block may control all gate terminals and switches, or it may control only clusters of gate terminals and switches which may then be controlled by local logic units (e.g. a signal bus from the central logic can control a couple of gate terminals which are decoded by a local logic unit close to these gate terminals, in order to minimize the space consumption of signal lines). Similarly, auxiliary switches may be added to selectively short-circuit an electrical contact region with one of its neighboring electrical contact regions. This may allow to cluster several deactivated electrical contact regions or several activated electrical contact regions to a single one (e.g. several electrical contact regions are connected together via auxiliary switches and only one of these electrical contact regions is directly connected to the supply or the voltmeter—this may increase the resistance at the gate terminals for some electrical contact regions, but it reduces complexity).

Figure 6A:
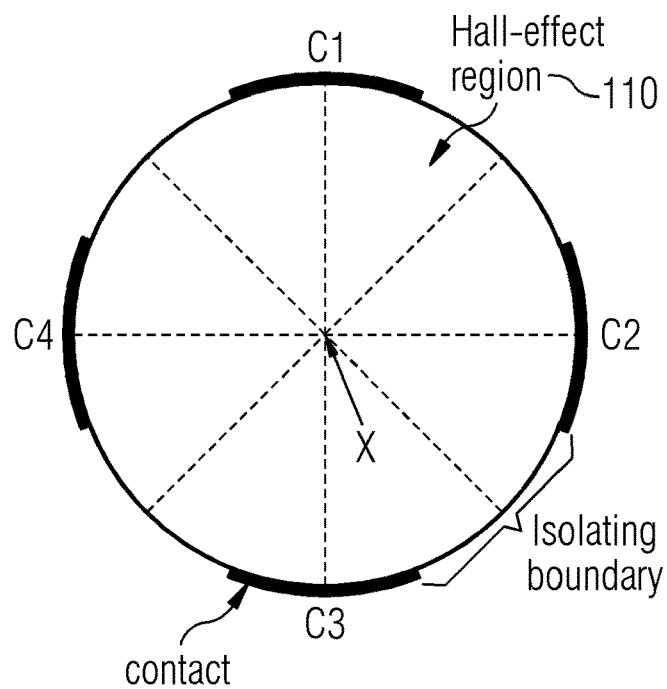
FIGS. 6a and 6b illustrate an example of a contacting scheme for a Hall sensor device for two consecutive spinning schemes according to one or more embodiments.
Figure 6B:
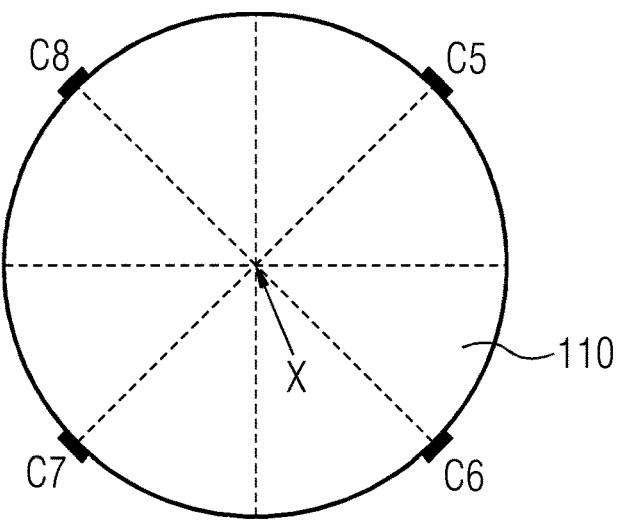

An example of a contacting scheme a Hall sensor device 600 for two consecutive spinning schemes is illustrated in FIGS. 6a and 6b.

FIG. 6a illustrates the contacting scheme during the first spinning scheme. The Hall sensor device 600 comprises a Hall effect region 110 and a plurality of electrical contract regions C1, ..., C8. The Hall effect region 110 is of a first conductivity type. The Hall effect region 110 is illustrated as circular element. However, the Hall effect region 110 may have other shapes like a square, a cross, an octagon, or a clover leave. The electrical contact regions are formed in respective wells of a second conductivity type which adjoin the Hall effect region 110, respectively.

In the first spinning scheme, a first subset of the plurality of electrical contact regions is coupled to the Hall effect region 110, e.g., the electrical contact regions C1, C2, C3 and C4. The electrical contact regions of the first subset of the plurality of electrical contact regions are rotated by 90° with respect to each other about a geometrical center X of the Hall effect region 110. For connecting single ones of the plurality of electrical contact regions, the Hall sensor device 600 comprises circuitry comprising a plurality of control terminals (not illustrated). Each control terminal controls a concentration of majority carriers of the first conductivity type in an associated well of the second conductivity type. In the first spinning scheme, the circuitry selectively applies control signals to a first subset of the plurality of control terminals to form channels conducting majority carriers of the first conductivity type in the associated wells. That is control signals are applied to control terminals associated to electrical contact regions C1, C2, C3 and C4 in order to form channels conducting majority carriers of the first conductivity type in the wells of the second conductivity type that are associated to the electrical contact regions C1, C2, C3 and C4.

The four electrical contact regions C1, C2, C3 and C4 may, e.g., be homogeneous (i.e. non-interleaving), equally sized and symmetrically distributed near the perimeter of the Hall effect region 110. A first complete spinning scheme is applied to these contacts. For example, electric energy (e.g. from a current or a voltage source) is supplied to the Hall effect using the electrical contact regions C1 and C3 while an output signal of the Hall effect region 110 is tapped using the electrical contact regions C2 and C4 in a first phase of the first spinning scheme. Then, electric energy is supplied to the Hall effect region 110 using the electrical contact regions C2 and C4 while an output signal of the Hall effect region 110 is tapped using the electrical contact regions C1 and C3 in a consecutive second phase of the first spinning scheme. After finishing the first spinning scheme, the four electrical contact regions C1, C2, C3 and C4 are de-activated by the circuitry (i.e. they are switched high ohmic).

In the second spinning scheme, a second subset of the plurality of electrical contact regions is coupled to the Hall effect region 110, e.g., the electrical contact regions C5, C6, C7 and C8 as illustrated in FIG. 6b. Also the electrical contact regions of the second subset of the plurality of electrical contact regions are rotated by 90° with respect to each other about a geometrical center X of the Hall effect region 110. In the second spinning scheme, the circuitry selectively applies control signals to a second subset of the plurality of control terminals to form channels conducting majority carriers of the first conductivity type in the associated wells. That is control signals are applied to control terminals associated to electrical contact regions C5, C6, C7 and C8 in order to form channels conducting majority carriers of the first conductivity type in the wells of the second conductivity type that are associated to the electrical contact regions C5, C6, C7 and C8.

The four electrical contact regions C5, C6, C7 and C8 may, e.g., be homogeneous, of equal size and symmetrically distributed near the perimeter of the Hall effect region 110. Each electrical contact region of the second subset of the plurality of electrical contact regions is arranged between two electrical contact regions of the first subset of the plurality of electrical contact regions, respectively. For example, electrical contact region C5 of the second subset is arranged between electrical contact regions C1 and C2 of the first subset. It is evident from FIGS. 6a and 6b that none of the plurality of control terminals comprised by the first subset is comprised by the second subset. As indicated in FIGS. 6a and 6b, the plurality of electrical contact regions may be of different size. Alternatively, the plurality of electrical contact regions may be equal in size.

A second complete spinning scheme is applied to the four electrical contact regions C5, C6, C7 and C8. For example, electric energy (e.g. from a current or a voltage source) is supplied to the Hall effect using the electrical contact regions C5 and C7 while an output signal of the Hall effect region 110 is tapped using the electrical contact regions C6 and C8 in a first phase of the second spinning scheme. Then, electric energy is supplied to the Hall effect region 110 using the electrical contact regions C6 and C8 while an output signal of the Hall effect region 110 is tapped using the electrical contact regions C5 and C7 in a consecutive second phase of the second spinning scheme.

The output signals of the first and the second complete spinning schemes are combined (e.g. added up or averaged) by combining circuitry (not illustrated) to give an overall output signal of the Hall sensor device 600. The combined output signal of the Hall sensor device 600 may have a lower residual offset than the individual output signals of the Hall effect region 110 for the first and the second spinning scheme.

It is to be noted that the parts of the Hall effect region's boundary, which are shorted together by the electrical contact regions C1, C2, C3 and C4 during the first spinning scheme, are isolating boundaries during the second spinning scheme. That is, during a respective spinning scheme merely four (homogeneous) electrical contact regions are effectively present and the other contacts are effectively absent.

Merely the first subset of the plurality of electrical contact regions C1, C2, C3 and C4 is activated during the first spinning scheme, whereas merely the second subset of the plurality of electrical contact regions C5, C6, C7 and C8 is activated during the second spinning scheme. Hence, short circuiting of the electrical supply signal and short circuiting of the Hall effect region's output signal is reduced. The homogeneity of the electrical field and the current/voltage distribution inside the Hall effect region may, thus, be increased, so that the residual offset of the Hall sensor device 600 may be reduced compared to conventional approaches.

As indicated in FIGS. 6a and 6b, the plurality of electrical contact regions may be arranged along a large part of the Hall effect region's periphery. For example, the plurality of electrical contact regions may be arranged along at least 75%, 80%, 85%, 90%, 95%, or more of the Hall effect region's periphery.

The operation of a Hall sensor device according to the proposed concept or examples illustrated herein may further be extended by a third, fourth, fifth, etc. spinning scheme where further contacts are activated. An example of a contacting scheme for a Hall sensor device 700 for four consecutive spinning schemes is illustrated in FIGS. 7a to 7d.

Figure 7A:
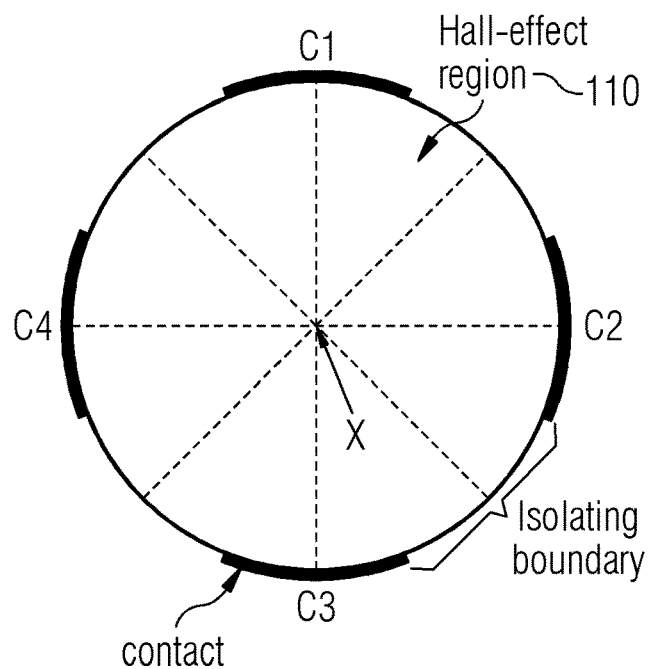
FIGS. 7a to 7d illustrate an example of a contacting scheme for a Hall sensor device for four consecutive spinning schemes according to one or more embodiments.

The Hall sensor device 700 illustrated in FIG. 7a comprises a Hall effect region 110 and a plurality of electrical contacts C1, . . . , C16. In the first spinning scheme a first subset of the plurality of electrical contacts is coupled to the Hall effect region 110, i.e., the electrical contacts C1, C2, C3 and C4.

Figure 7B:
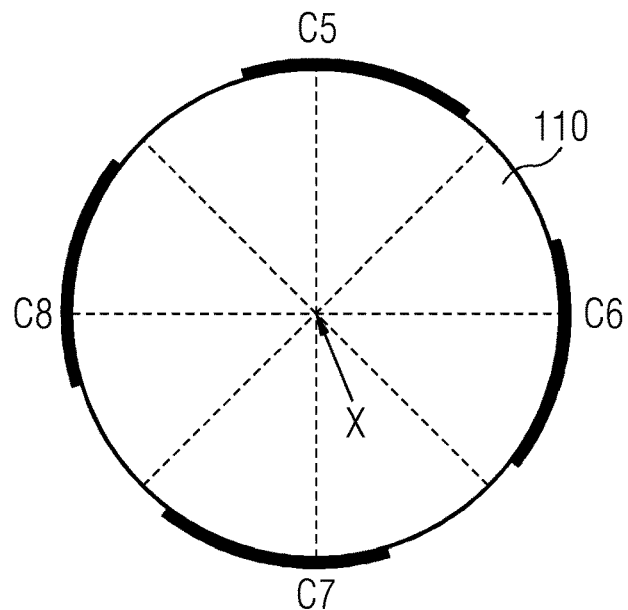

In the second spinning scheme a second subset of the plurality of electrical contacts is coupled to the Hall effect region 110, i.e., the electrical contacts C5, C6, C7 and C8 as illustrated in FIG. 7b.

Figure 7C:
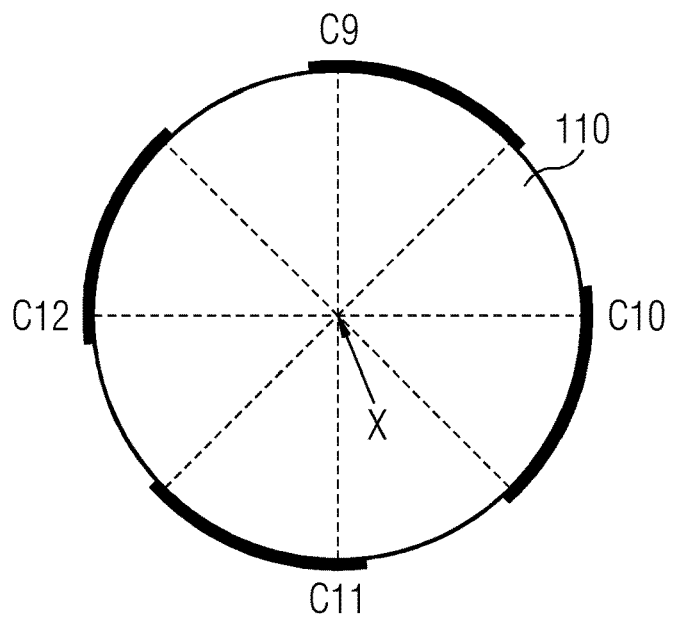

In the third spinning scheme a third subset of the plurality of electrical contacts is coupled to the Hall effect region 110, i.e., the electrical contacts C9, C10, C11 and C12 as illustrated in FIG. 7c.

Figure 7D:
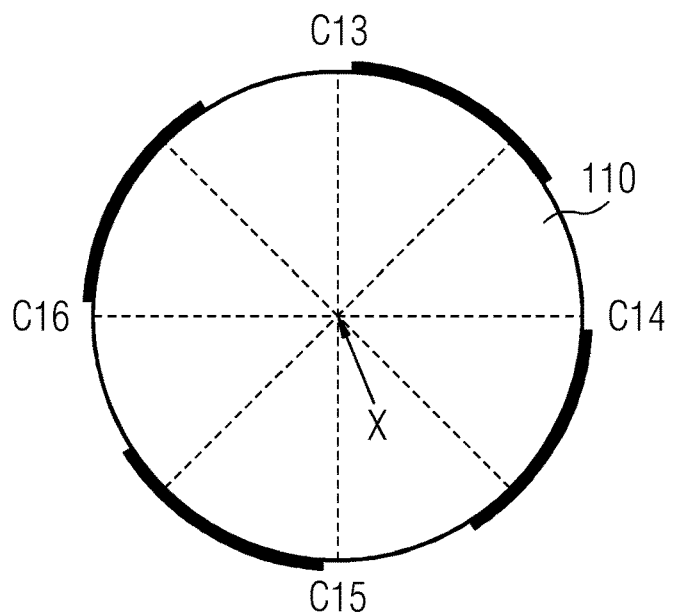

In the fourth spinning scheme a fourth subset of the plurality of electrical contacts is coupled to the Hall effect region 110, i.e., the electrical contacts C13, C14, C15 and C16 as illustrated in FIG. 7d.

In this way the electrical contacts can be large and move in small steps over the complete perimeter: For example, electrical contact C1 in the first spinning scheme may be rotated clockwise by 10° to become electrical contact C5 in the second spinning scheme. Electrical contact C5 in the second spinning scheme may then again be rotated about the center X of the Hall effect region 110 along its perimeter by 10° to become electrical contact C9 in the third spinning scheme. Electrical contact C9 in the third spinning scheme may then be rotated clockwise by 10° to become electrical contact C13 in the fourth spinning scheme.

This may allow to average non-linear effects in the Hall effect region 110 caused by inhomogeneities near the electrical contacts over all the spinning schemes. One efficient way to achieve these slowly rotating electrical contacts is to split up each electrical contact into a number of small electrical contacts—in the above example each small contact covers, e.g., 10° or less (e.g. the small contacts cover 8° each and are spaced apart from each other by 2°). For example, several electrical contact regions may be combined to one single electrical contact. The circuitry may, e.g., activate electrical contact regions m, m+1, m+2, . . . , m+n (being part of a first subset of electrical contact regions) in the first spinning scheme and connect them together to electrical contact C1. In the second spinning scheme the circuitry may, e.g., activate electrical contact regions m+1, m+2, . . . , m+n, m+n+1 (being part of a second subset of electrical contact regions) and connect them together to electrical contact C5. That is, at least one of the plurality of control terminals comprised by the first subset may be comprised by the second subset. On the contrary, at least one of the plurality of control terminals comprised by the first subset is not comprised by the second subset. In the first spinning scheme the electrical contact regions m−1 and m+n+1 are de-activated—i.e. they are effectively absent—whereas in the second spinning scheme electrical contact regions m and m+n+2 are de-activated.

Similarly, third and fourth subsets of the plurality of electrical contact regions may be selected for the third and fourth spinning schemes and be combined to electrical contacts.

That is, the electrical contacts of the first, the second, the third and the fourth complete spinning scheme may partly overlap.

Figure 8:
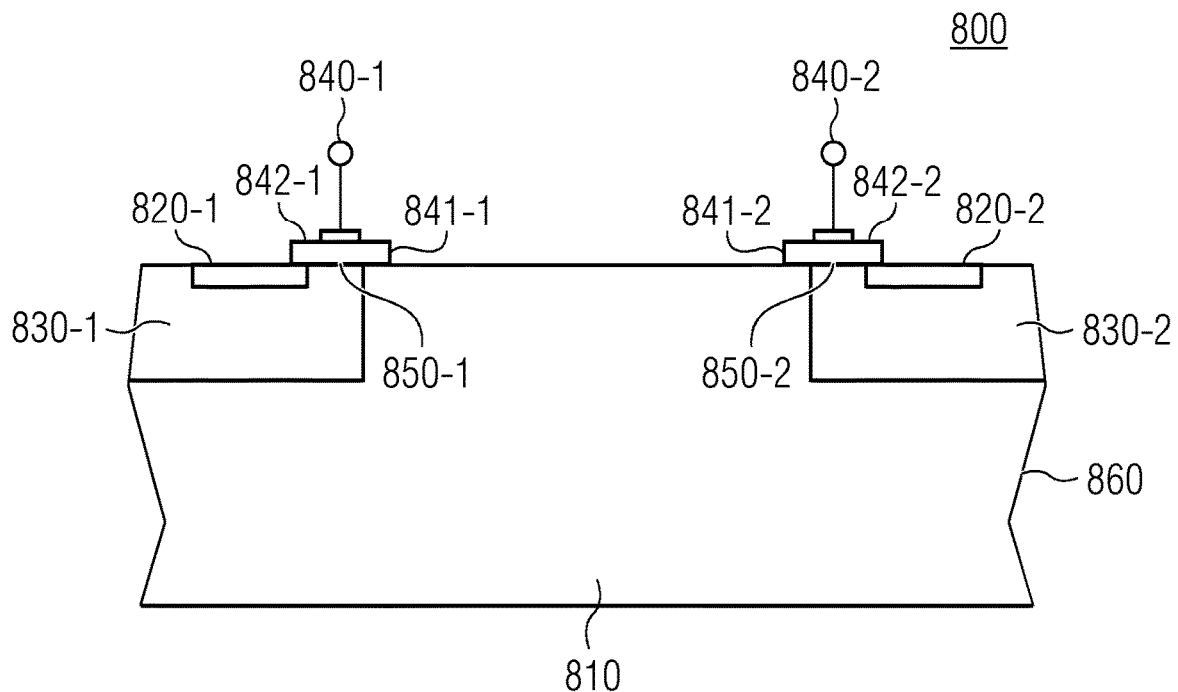
FIG. 8 illustrates a further example of a Hall sensor device according to one or more embodiments.

In FIG. 8, a cross section of another Hall sensor device 800 is illustrated. The Hall sensor device 800 comprises a Hall effect region 810 of a first conductivity type (e.g. n-doped) which is implemented in a semiconductor substrate 860. In the Hall effect region 810 the Hall effect takes place when an external magnetic field (not illustrated) is present.

The Hall sensor device 800 further comprises a plurality of electrical contact regions configured to provide electrical signals to/from the Hall effect region 810. For this purpose, the electrical contact regions may, e.g., be coupled to respective terminals (not illustrated). For the sake of simplicity, merely two electrical contact regions 820-1 and 820-2 are illustrated. However, it is to be noted that any number of electrical contact regions may be provided. For example, 2, 3, 4, 8, 16, 24, 32 or more electrical contact regions may be provided. The electrical contact regions may, e.g., be formed in respective wells of a different second conductivity type (e.g. p-doped) which adjoin the Hall effect region 810. For example, electrical contact region 820-1 may be formed in well 830-1 and electrical contact region 820-2 may be formed in well 830-2, wherein both wells 830-1 and 830-2 adjoin the Hall effect region 810 (i.e. each well of the second conductivity type shares a common boundary with the Hall effect region 810). For example, at least one (or all) of the plurality of electrical contact regions may be of the first conductivity type. Alternatively, one or more of the plurality of electrical contact regions may be formed by a metal contact.

The Hall sensor device 800 further comprises circuitry comprising a plurality of control terminals. For the sake of simplicity, again merely two control terminals 840-1 and 840-2 are illustrated. The plurality of control terminals are configured to form during a first operating phase (e.g. a first spinning scheme) a first plurality of channels in the semiconductor substrate 860 (directly) between the Hall effect region 810 and a first subset of the plurality of electrical contact regions (e.g. by applying a first potential to the respective control terminals), wherein the channels of the first plurality of channels conduct majority carriers of the first conductivity type. That is, at least one of the plurality of electrical contact regions is not comprised by the first subset. For example, the control terminal 840-1 may be comprised by the first subset of the plurality of control terminals. A first subset of the control terminals may, e.g., be configured to control a concentration of majority carriers of the first conductivity type in associated wells of the second conductivity type. In the example of FIG. 8, the control terminal 840-1 is coupled to an associated electrode 842-1 (e.g. made of low-ohmic poly-silicon) which is arranged on an associated oxide layers 841-1 that is formed on the well 830-1. The control terminal 840-1 may, e.g., cause the formation of an inversion layer at the interface between the well 830-1 and the oxide layer 841-1. Accordingly, a channel 850-1 conducting majority carriers of the first conductivity type is formed in well 830-1. That is, channel 850-1 is formed in the semiconductor substrate 860 directly between the Hall effect region 810 and the electrical contact region 820-1. Hence, an electrically conductive channel is formed between the Hall effect region 110 and the electrical contact region 820-1 during the first operating phase.

The plurality of control terminals are further configured to form during a second operating phase (e.g. a second spinning scheme) a second plurality of channels in the semiconductor substrate 860 (directly) between the Hall effect region 810 and a second subset of the plurality of electrical contact regions (e.g. by applying the first potential to the respective control terminals), wherein the channels of the second plurality of channels conduct majority carriers of the first conductivity type. For example, a second subset of the control terminals may be configured to control a concentration of majority carriers of the first conductivity type in associated wells of the second conductivity type. In the example of FIG. 8, the control terminal 840-2 is coupled to an associated electrode 842-2 (e.g. made of low-ohmic poly-silicon) which is arranged on an associated oxide layers 841-2 that is formed on the well 830-2. The control terminal 840-2 may, e.g., cause the formation of an inversion layer at the interface between the well 830-2 and the oxide layer 841-2. Accordingly, a channel 850-2 conduct majority carriers of the first conductivity type is formed in well 830-2. That is, channel 850-2 is formed in the semiconductor substrate 860 directly between the Hall effect region 810 and the electrical contact region 820-2. Hence, an electrically conductive channel is formed between the Hall effect region 110 and the electrical contact region 820-2 during the second operating phase.

In the Hall sensor device 800 no channel conducting majority carriers of the first conductivity type is formed in well 830-2 during the first operating phase, whereas no channel conducting majority carriers of the first conductivity type is formed in well 830-1 during the second operating phase. That is, single ones of the plurality of electrical contact regions may be selectively activated and deactivated. Since merely a first subset of the plurality of electrical contact regions is activated during the first operating phase and since merely a second subset of the plurality of electrical contact regions is activated during the second operating phase, short circuiting of the electrical supply signal and short circuiting of the Hall effect region's output signal is reduced. The homogeneity of the electrical field and the current/voltage distribution inside the Hall effect region 810 may, hence, be increased. Accordingly, the residual offset of the Hall sensor device 800 may be reduced compared to conventional approaches.

In some examples, the Hall sensor device 800 may further comprise combining circuitry (not illustrated) configured to combine the electrical signals from the Hall effect region provided (tapped) by the first subset of the plurality of electrical contact regions during the first operating phase and the electrical signals from the Hall effect region provided (tapped) by the first subset of the plurality of electrical contact regions during the second operating phase. The combined electrical signals from the Hall effect region 810 may form an output signal of the Hall sensor device 800. For example, the combining circuitry may be configured to linearly combine the electrical signals from the Hall effect region for both operating phases (e.g. both spinning schemes). In particular, the electrical signals from the Hall effect region 810 may be summed or subtracted from each other, wherein the absolute value of the respective coefficients of the linear combination is equal to one. Accordingly, the output signal of the Hall sensor device 800 may exhibit reduced residual offset compared to conventional approaches.

The plurality of electrical contract regions may in some examples be arranged at a peripheral portion of the Hall effect region 810 as indicated in FIG. 8.

In some examples, each electrical contact region of the second subset of the plurality of electrical contact regions may be arranged between two electrical contact regions of the first subset of the plurality of electrical contact regions, respectively. The electrical contact regions of the first subset of the plurality of electrical contact regions may further be rotated by 90° with respect to each other about a geometrical center of the Hall effect region 810.

For example, the plurality of electrical contact regions may be arranged along at least 75%, 80%, 85%, 90%, 95%, or more of the Hall effect region's periphery. The plurality of electrical contact regions may in some examples be equal in size.

In some examples, none of the plurality of control terminals comprised by the first subset may be comprised by the second subset. Alternatively, at least one of the plurality of control terminals comprised by the first subset may be comprised by the second subset.

Figure 9:
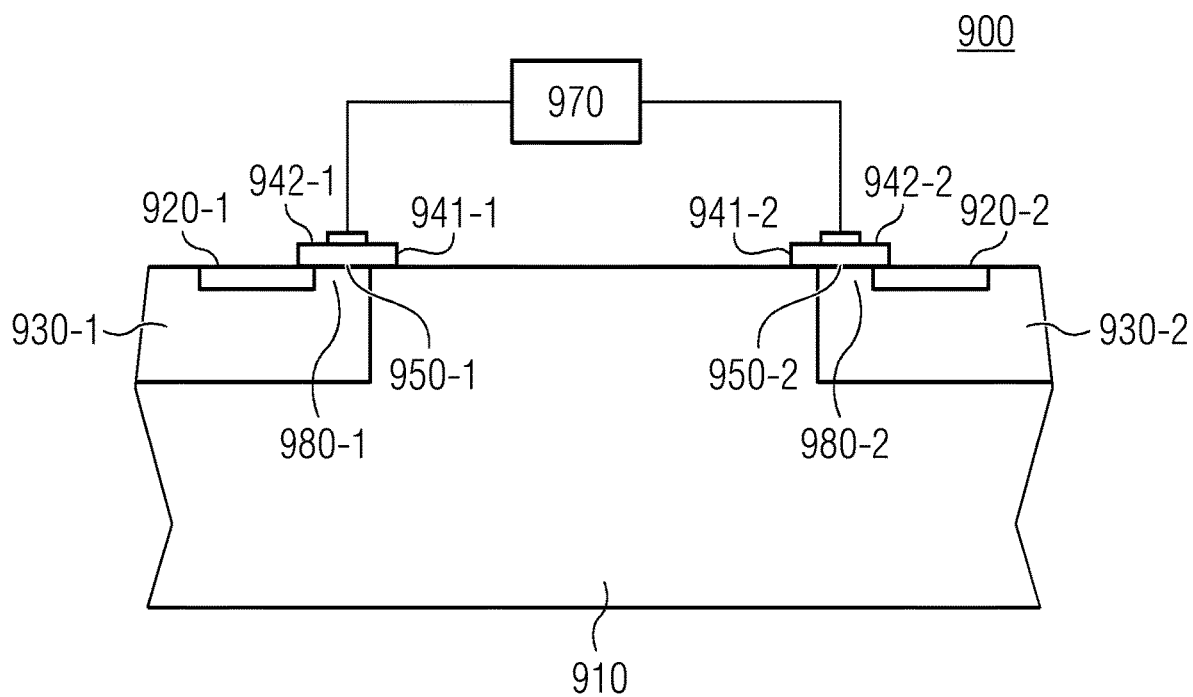
FIG. 9 illustrates a still further example of a Hall sensor device according to one or more embodiments.

FIG. 9 illustrates a cross section of another Hall sensor device 900. The Hall sensor device 900 comprises a Hall effect region 910 of a first conductivity type (e.g. n-doped). In the Hall effect region 910 the Hall effect takes place when an external magnetic field (not illustrated) is present.

The Hall sensor device 900 further comprises a plurality of electrical contact regions configured to provide electrical signals to/from the Hall effect region 910. For this purpose, the electrical contact regions may, e.g., be coupled to respective terminals (not illustrated). For the sake of simplicity, merely two electrical contact regions 920-1 and 920-2 are illustrated. However, it is to be noted that any number of electrical contact regions may be provided. For example, 2, 3, 4, 8, 16, 24, 32 or more electrical contact regions may be provided. The electrical contact regions may, e.g., be formed in respective wells of a different second conductivity type which adjoin the Hall effect region 910. For example, electrical contact region 920-1 may be formed in well 930-1 and electrical contact region 920-2 may be formed in well 930-2, wherein both wells 930-1 and 930-2 adjoin the Hall effect region 910 (i.e. each well of the second conductivity type shares a common boundary with the Hall effect region 910). For example, at least one (or all) of the plurality of electrical contact regions may be of the first conductivity type. Alternatively, one or more of the plurality of electrical contact regions may be formed by a metal contact.

The Hall sensor device 900 further comprises circuitry 970 configured to selectively couple a first subset of the plurality of electrical contact regions to the Hall effect region during at least one first operating phase (e.g. a first spinning scheme), and to selectively couple a different second subset of the plurality of electrical contact regions to the Hall effect region during at least one second operating phase (e.g. a second spinning scheme). It is to be noted that at least one of the plurality of electrical contact regions is not comprised by the first subset.

The circuitry may, e.g., comprise terminals which are connected to electrodes that are arranged on oxide layers on top of the wells of the second conductivity type (e.g. electrodes 942-1 and 942-2 arranged on oxide layers 941-1 and 941-2 on top of wells 930-1 and 930-2). During the first operating phase, a control signal may be applied to selected terminals in order to form a first plurality of channels between the Hall effect region 910 and the first subset of the plurality of electrical contact regions, wherein the channels of the first plurality of channels conduct majority carriers of the first conductivity type. By applying a control signal to a respective terminal, a conductance in the associated well of the second conductivity type may be controlled. For example, the specific conductance of a channel which is formed in the well of the second conductivity type may be controlled. In the example of FIG. 9, the circuitry 970 may, e.g., control the formation of an inversion layer at the interface between the well 930-1 and the oxide layer 941-1. Accordingly, a channel 950-1 conduct majority carriers of the first conductivity type is formed in well 930-1. That is, a conductivity in the boundary region 980-1 between the Hall effect region 910 and the electrical contact region 920-1 is substantially equal to, or higher than a conductivity in the Hall effect region 910 during the first operating phase.

During the second operating phase, a control signal may be applied to other selected terminals in order to form a second plurality of channels between the Hall effect region 910 and the second subset of the plurality of electrical contact regions, wherein the channels of the first plurality of channels conduct majority carriers of the first conductivity type. In the example of FIG. 9, the circuitry 970 may, e.g., control the formation of an inversion layer at the interface between the well 930-2 and the oxide layer 941-2. Accordingly, a channel 950-2 conducting majority carriers of the first conductivity type is formed in well 930-2. That is, a conductivity in the boundary region 980-2 between the Hall effect region 910 and the electrical contact region 920-2 is substantially equal to, or higher than a conductivity in the Hall effect region 910 during the first operating phase.

On the other hand, the electrical contact region 920-2 exhibits a high ohmic boundary condition to the Hall effect region 910 during the first operating phase since the channel 950-2 conducting majority carriers of the first conductivity type is merely formed during the second operating phase. Hence, a conductivity in the boundary portion 980-2 between the electrical contact region 920-2 and the Hall effect region 910 is at least hundred times lower than the conductivity in the Hall effect region 910 during the first operating phase. For the Hall effect region 910, the electrical contact region 920-2 is effectively present only during the second operating phase. The electrical contact region 920-2 is effectively short-circuited to the Hall effect region 910 during the second operating phase. On the contrary, the electrical contact region 920-2 is effectively absent for the Hall effect region 910 during the first operating phase. The boundary region 980-2 is, hence, effectively an isolating boundary between the electrical contact region 920-2 and the Hall effect region 910 during the first operating phase.

Similarly, the electrical contact region 920-1 exhibits a high ohmic boundary condition to the Hall effect region 910 during the second operating phase since the channel 950-1 conducting majority carriers of the first conductivity type is merely formed during the first operating phase. Hence, a conductivity in the boundary portion 980-1 between the electrical contact region 920-1 and the Hall effect region 910 is at least hundred times lower than the conductivity in the Hall effect region 910 during the second operating phase. For the Hall effect region 910, the electrical contact region 920-1 is effectively present only during the first operating phase. The electrical contact region 920-1 is effectively short-circuited to the Hall effect region 910 during the first operating phase. On the contrary, the electrical contact region 920-1 is effectively absent for the Hall effect region 910 during the second operating phase. The boundary region 980-1 is, hence, effectively an isolating boundary between the electrical contact region 920-1 and the Hall effect region 910 during the second operating phase.

Hence, regarding the plurality of electrical contact regions, each of the second subset of the plurality of electrical contact regions exhibits a high ohmic boundary condition to the Hall effect region during the first operating phase, whereas each of the first subset of the plurality of electrical contact regions exhibits a high ohmic boundary condition to the Hall effect region during the second operating phase.

That is, single ones of the plurality of electrical contact regions may be selectively activated and deactivated. Since merely a first subset of the plurality of electrical contact regions is activated during the first operating phase and since merely a second subset of the plurality of electrical contact regions is activated during the second operating phase, short circuiting of the electrical supply signal and short circuiting of the Hall effect region's output signal is reduced. The homogeneity of the electrical field and the current/voltage distribution inside the Hall effect region 910 may, hence, be increased. Accordingly, the residual offset of the Hall sensor device 900 may be reduced compared to conventional approaches.

In some examples, the Hall sensor device 900 may further comprise combining circuitry (not illustrated) configured to combine the electrical signals from the Hall effect region provided (tapped) by the first subset of the plurality of electrical contact regions during the first operating phase and the electrical signals from the Hall effect region provided (tapped) by the first subset of the plurality of electrical contact regions during the second operating phase. The combined electrical signals from the Hall effect region 910 may form an output signal of the Hall sensor device 900. For example, the combining circuitry may be configured to linearly combine the electrical signals from the Hall effect region for both operating phases (e.g. both spinning schemes). In particular, the electrical signals from the Hall effect region may be summed or subtracted from each other, wherein the absolute value of the respective coefficients of the linear combination is equal to one. Accordingly, the output signal of the Hall sensor device 900 may exhibit reduced residual offset compared to conventional approaches.

The plurality of electrical contract regions may in some examples be arranged at a peripheral portion of the Hall effect region 910 as indicated in FIG. 9.

In some examples, each electrical contact region of the second subset of the plurality of electrical contact regions may be arranged between two electrical contact regions of the first subset of the plurality of electrical contact regions, respectively. The electrical contact regions of the first subset of the plurality of electrical contact regions may further be rotated by 90° with respect to each other about a geometrical center of the Hall effect region 910.

For example, the plurality of electrical contact regions may be arranged along at least 75%, 80%, 85%, 90%, 95%, or more of the Hall effect region's periphery. The plurality of electrical contact regions may in some examples be equal in size.

Figure 10:
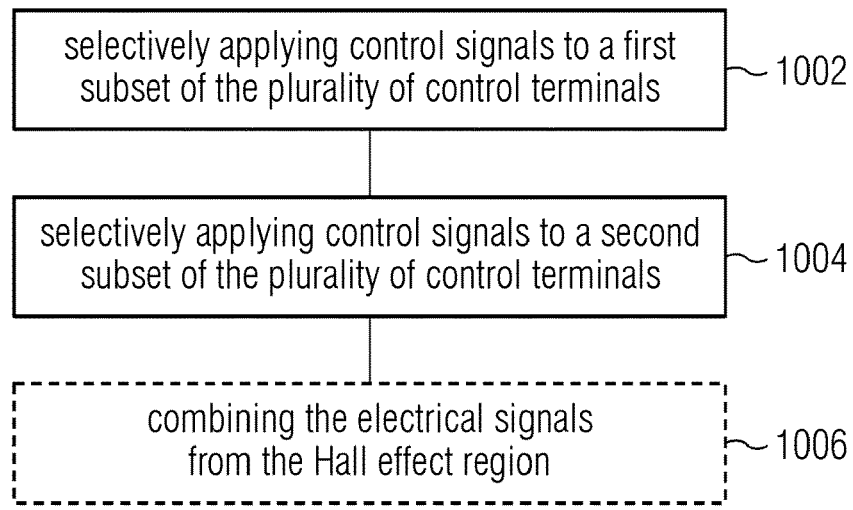
FIG. 10 illustrates a flowchart of an example of a method for operating a Hall sensor device according to one or more embodiments.

An example of a method 1000 for operating a Hall sensor device is illustrated by means of a flowchart in FIG. 10. The Hall sensor device comprises a Hall effect region of a first conductivity type and a plurality of electrical contact regions configured to provide electrical signals to/from the Hall effect region using a plurality of control terminals. Each electrical contact region is formed in a respective well of a different second conductivity type which adjoins the Hall effect region. Each control terminal is configured to control a conductance in an associated well of the second conductivity type. The method 1000 comprises in a step 1002 selectively applying control signals to a first subset of the plurality of control terminals to form channels conducting majority carriers of the first conductivity type in the associated wells during a first operating phase. Further, the method 1000 comprises a step 1004 of selectively applying control signals to a different second subset of the plurality of control terminals to form channels conducting majority carriers of the first conductivity type in the associated wells during a second operating phase.

In some examples, the first operating phase comprises a full first spinning scheme, and wherein the second operating phase comprises a full second spinning scheme.

Optionally, the method 1000 further comprises a step 1006 of combining the electrical signals from the Hall effect region provided by the first subset of the plurality of electrical contact regions during the first operating phase and the electrical signals from the Hall effect region provided by the second subset of the plurality of electrical contact regions during the second operating phase to an output signal of the Hall sensor device.

More details and aspects of the method are mentioned in connection with the proposed concept or one or more examples described above (e.g. FIGS. 1 to 7). The method may comprise one or more additional optional features corresponding to one or more aspects of the proposed concept or one or more examples described above.

Figure 11:
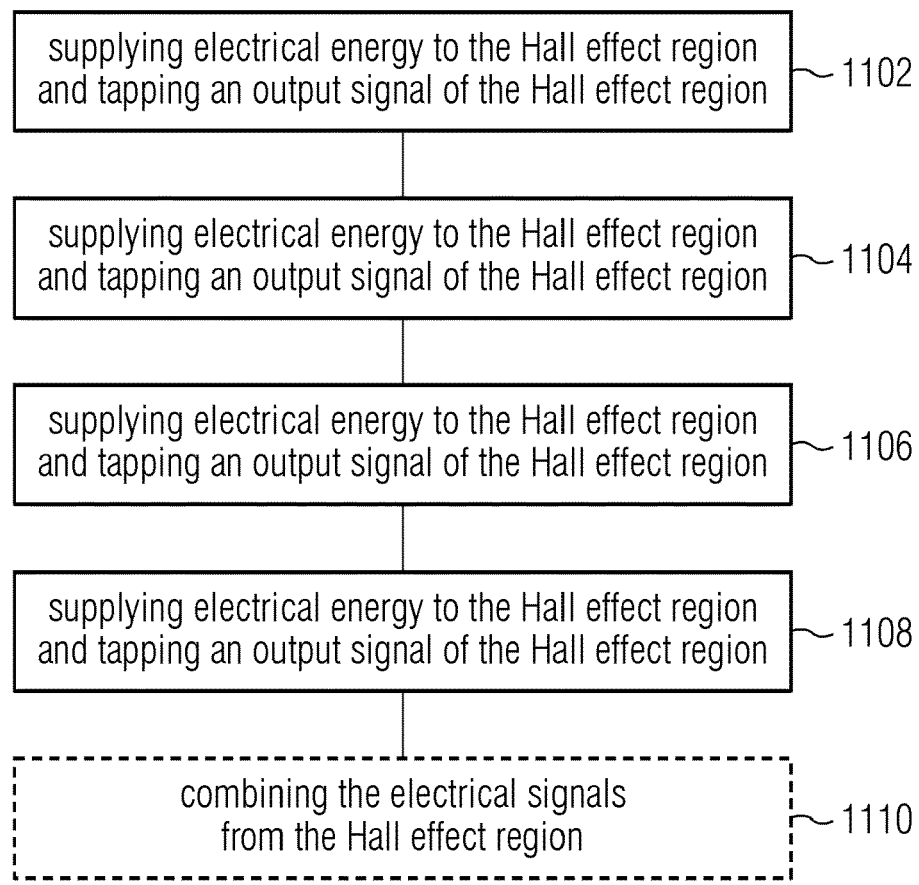
FIG. 11 illustrates a flowchart of an example of a method for a Hall sensor device according to one or more embodiments.

An example of a method 1100 for a Hall sensor device comprising a Hall effect region is illustrated by means of a flowchart in FIG. 11. The method 1100 comprises in a step 1102 supplying electric energy to the Hall effect region using a first pair of electrical contacts and tapping an output signal of the Hall effect region using a second pair of electrical contacts in a first operating phase. In a step 1104, the method 1100 further comprises supplying electric energy to the Hall effect region using the second pair of electrical contacts and tapping an output signal of the Hall effect region using the first pair of electrical contacts in a second operating phase. Further, the method 1100 comprises in a step 1106 supplying electric energy to the Hall effect region using a third pair of electrical contacts and tapping an output signal of the Hall effect region using a fourth pair of electrical contacts in a third operating phase. In a step 1108, the method 1100 further comprises supplying electric energy to the Hall effect region using the fourth pair of electrical contacts and tapping an output signal of the Hall effect region using the third pair of electrical contacts in a fourth operating phase.

At least one electrical contact of the third and the fourth pair of electrical contacts exhibits a high ohmic boundary condition to the Hall effect region during the first operating phase, wherein at least one electrical contact of the first and the second pair of electrical contacts exhibits a high ohmic boundary condition to the Hall effect region during the second operating phase. As discussed above, in the high ohmic boundary condition a conductivity in a boundary portion between a respective electrical contact and the Hall effect region is at least hundred times lower than a conductivity in the Hall effect region.

Optionally, the method 1100 further comprises a step 1110 of combining the output signals of the Hall effect region in the first operating state, the second operating state, third operating state and the fourth operating state to generate an output signal of the Hall sensor device.

More details and aspects of the method are mentioned in connection with the proposed concept or one or more examples described above (e.g. FIGS. 6, 7 and 9). The method may comprise one or more additional optional features corresponding to one or more aspects of the proposed concept or one or more examples described above.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:
1. A Hall sensor device, comprising:
a Hall effect region of a first conductivity type formed in a semiconductor substrate;
a plurality of first wells of a second conductivity type formed in the semiconductor substrate;
a plurality of electrical contact regions configured to provide electrical signals to and from the Hall effect region, wherein each electrical contact region is formed in a respective first well of the first plurality of wells that adjoins the Hall effect region, wherein each electrical contact region is laterally separated from the Hall effect region by its respective first well; and
circuitry comprising a plurality of control terminals, wherein each control terminal is configured to control a conductance in an associated first well of the plurality of first wells, wherein the circuitry is configured to:
selectively apply control signals to a first subset of the plurality of control terminals to form channels conducting majority carriers of the first conductivity type in associated first wells of the plurality of first wells during a first operating phase,
wherein the first subset of the plurality of control terminals are configured to activate an associated first subset of the plurality of electrical contact regions during the first operating phase, the associated first subset of the plurality of electrical contact regions including at least two electrical contact regions used to supply at least one first input signal to the Hall effect region during the first operating phase and at least two electrical contact regions used to tap at least one first output signal from the Hall effect region during the first operating phase, and
selectively apply control signals to a second subset of the plurality of control terminals, different from the first subset of the plurality of control terminals, to form channels conducting majority carriers of the first conductivity type in associated first wells of the plurality of first wells during a second operating phase,
wherein the second subset of the plurality of control terminals are configured to activate an associated second subset of the plurality of electrical contact regions during the second operating phase, the associated second subset of the plurality of electrical contact regions including at least two electrical contact regions used to supply at least one second input signal to the Hall effect region during the second operating phase and at least two electrical contact regions used to tap at least one second output signal from the Hall effect region during the second operating phase.

2. The Hall sensor device of claim 1, wherein the first operating phase comprises a full first spinning scheme, and wherein the second operating phase comprises a full second spinning scheme.

3. The Hall sensor device of claim 1, further comprising:
combining circuitry configured to combine the at least one first output signal from the Hall effect region provided by the associated first subset of the plurality of electrical contact regions during the first operating phase with the at least one second output signal from the Hall effect region provided by the associated second subset of the plurality of electrical contact regions during the second operating phase to generate a combined output signal of the Hall sensor device.

4. The Hall sensor device of claim 1, wherein the plurality of electrical contact regions are equal in size.

5. The Hall sensor device of claim 1, wherein the plurality of electrical contact regions are arranged along at least 75% of a periphery of the Hall effect region.

6. The Hall sensor device of claim 1, wherein the first subset of the plurality of control terminals and the second subset of the plurality of control terminals are mutually exclusive from each other.

7. The Hall sensor device of any of claim 1, wherein at least one of the plurality of control terminals comprised by the first subset of the plurality of control terminals is comprised by the second subset of the plurality of control terminals.

8. The Hall sensor device of claim 1, wherein at least one of the plurality of electrical contact regions is of the first conductivity type.

9. The Hall sensor device of claim 1, wherein:
the channels conducting the majority carriers of the first conductivity type in the associated first wells during the first operating phase are formed between the associated first subset of the plurality of electrical contact regions and the Hall effect region, and
the channels conducting the majority carriers of the first conductivity type in the associated first wells during the second operating phase are formed between the associated second subset of the plurality of electrical contact regions and the Hall effect region.

10. The Hall sensor device of claim 9, wherein each electrical contact region of the associated second subset of the plurality of electrical contact regions is arranged between two electrical contact regions of the associated first subset of the plurality of electrical contact regions, respectively.

11. The Hall sensor device of claim 9, wherein the associated first subset of the plurality of electrical contact regions are rotated by 90° with respect to each other about a geometrical center of the Hall effect region.

12. The Hall sensor device of any of claim 1, further comprising:
a plurality of second wells of the first conductivity type, each adjoining the Hall effect region and a respective first well of the second conductivity type, wherein a concentration of majority carriers of the first conductivity type in the plurality of second wells of the first conductivity type is higher than a concentration of majority carriers of the first conductivity type in the Hall effect region.

13. The Hall sensor device of claim 12, wherein a thickness of each of the plurality of second wells of the first conductivity type is 50% or more of a thickness of the Hall effect region.

14. The Hall sensor device of claim 12, wherein:
the channels conducting the majority carriers of the first conductivity type in the associated first wells of the second conductivity type during the first operating phase are formed between the associated first subset of the plurality of electrical contact regions and an associated first subset of the plurality of second wells of the first conductivity type, and
the channels conducting the majority carriers of the first conductivity type in the associated first wells of the second conductivity type during the second operating phase are formed between the associated second subset of the plurality of electrical contact regions and an associated second subset of the plurality of second wells of the first conductivity type.

15. The Hall sensor device of claim 1, wherein the circuitry is configured to deactivate the associated first subset of the plurality of electrical contact regions during the second operating phase, and to deactivate the associated second subset of the plurality of electrical contact regions during the first operating phase.

16. The Hall sensor device of claim 1, wherein each of the plurality of electrical contact regions is configured to supply an input signal to the to the Hall effect region during one of a plurality of operating phases and tap an output signal from the Hall effect region during a different one of the plurality of operating phases.

17. A Hall sensor device, comprising:
a Hall effect region of a first conductivity type implemented in a semiconductor substrate;
a plurality of wells of a second conductivity type formed in the semiconductor substrate;
a plurality of electrical contact regions implemented in the semiconductor substrate and configured to provide electrical signals to and from the Hall effect region, wherein each electrical contact region is formed in a respective well of the plurality of wells that adjoins the Hall effect region, wherein each electrical contact region is laterally separated from the Hall effect region by its respective well; and
a plurality of control terminals configured to:
form during a first operating phase a first plurality of channels in the semiconductor substrate between the Hall effect region and a first subset of the plurality of electrical contact regions which conduct majority carriers of the first conductivity type, wherein the first subset of the plurality of electrical contact regions include at least two electrical contact regions used to supply at least one first input signal to the Hall effect region during the first operating phase and at least two electrical contact regions used to tap at least one first output signal from the Hall effect region during the first operating phase, and
to form during a second operating phase a second plurality of channels in the semiconductor substrate between the Hall effect region and a second subset of the plurality of electrical contact regions, different from the first subset, which conduct majority carriers of the first conductivity type, wherein the second subset of the plurality of electrical contact regions include at least two electrical contact regions used to supply at least one second input signal to the Hall effect region during the second operating phase and at least two electrical contact regions used to tap at least one second output signal from the Hall effect region during the second operating phase.

18. The Hall sensor device of claim 17, wherein:
the first operating phase comprises a full first spinning scheme, and
the second operating phase comprises a full second spinning scheme.

19. The Hall sensor device of claim 17, further comprising:
combining circuitry configured to combine the at least one first output signal from the Hall effect region provided by the first subset of the plurality of electrical contact regions during the first operating phase with the at least one second output signal from the Hall effect region provided by the second subset of the plurality of electrical contact regions during the second operating phase to generate a combined output signal of the Hall sensor device.

20. The Hall sensor device of claim 17, wherein the plurality of control terminals is configured to deactivate the first subset of the plurality of electrical contact regions during the second operating phase, and to deactivate the second subset of the plurality of electrical contact regions during the first operating phase.

21. The Hall sensor device of claim 17, wherein each of the plurality of electrical contact regions is configured to supply an input signal to the to the Hall effect region during one of a plurality of operating phases and tap an output signal from the Hall effect region during a different one of the plurality of operating phases.

22. A Hall sensor device, comprising:
a Hall effect region;
a plurality of wells;
a plurality of electrical contact regions configured to provide electrical signals to and from the Hall effect region, wherein each electrical contact region is formed in a respective well of the plurality of wells that adjoins the Hall effect region, wherein each electrical contact region is laterally separated from the Hall effect region by its respective well; and
circuitry configured to selectively couple a first subset of the plurality of electrical contact regions to the Hall effect region during at least one first operating phase, and to selectively couple a second subset of the plurality of electrical contact regions, different from the first subset, to the Hall effect region during at least one second operating phase,
wherein the first subset of the plurality of electrical contact regions include at least two electrical contact regions used to supply at least one first input signal to the Hall effect region during the at least one first operating phase and at least two electrical contact regions used to tap at least one first output signal from the Hall effect region during the at least one first operating phase,
wherein the second subset of the plurality of electrical contact regions include at least two electrical contact regions used to supply at least one second input signal to the Hall effect region during the at least one second operating phase and at least two electrical contact regions used to tap at least one second output signal from the Hall effect region during the at least one second operating phase,
wherein each of the second subset of the plurality of electrical contact regions exhibits a high ohmic boundary condition to the Hall effect region during the first operating phase, and
wherein each of the first subset of the plurality of electrical contact regions exhibits a high ohmic boundary condition to the Hall effect region during the second operating phase.

23. The Hall sensor device according to claim 22, wherein in the high ohmic boundary condition a conductivity in a boundary portion between a respective electrical contact region and the Hall effect region is at least hundred times lower than a conductivity in the Hall effect region.

24. The Hall sensor device of claim 22, wherein:
the first operating phase comprises a full first spinning scheme, and
the second operating phase comprises a full second spinning scheme.

25. The Hall sensor device of claim 22, further comprising:
combining circuitry configured to combine the at least one first output signal from the Hall effect region provided by the first subset of the plurality of electrical contact regions during the first operating phase with the at least one second output signal from the Hall effect region provided by the second subset of the plurality of electrical contact regions during the second operating phase to generate a combined output signal of the Hall sensor device.

26. The Hall sensor device of claim 22, wherein the first subset of the plurality of electrical contact regions are deactivated during the second operating phase, and the second subset of the plurality of electrical contact regions are deactivated during the first operating phase.

27. The Hall sensor device of claim 22, wherein each of the plurality of electrical contact regions is configured to supply an input signal to the to the Hall effect region during one of a plurality of operating phases and tap an output signal from the Hall effect region during a different one of the plurality of operating phases.

* * * * *